United States Patent
Umezawa et al.

(10) Patent No.: US 9,760,013 B2
(45) Date of Patent: Sep. 12, 2017

(54) EXPOSURE APPARATUS, MASK, AND OPTICAL FILM

(71) Applicant: ARISAWA MFG. CO., LTD., Niigata (JP)

(72) Inventors: Yasuaki Umezawa, Niigata (JP); Tatsuya Sato, Niigata (JP); Kazuhiro Ura, Niigata (JP); Kenichi Watabe, Niigata (JP); Yuichi Kakubari, Niigata (JP)

(73) Assignee: ARISAWA MFG. CO., LTD, Nigata (JP)

( * ) Notice: Subject to any disclaimer, the term of this patent is extended or adjusted under 35 U.S.C. 154(b) by 261 days.

(21) Appl. No.: 14/692,756

(22) Filed: Apr. 22, 2015

(65) Prior Publication Data

US 2015/0227057 A1 Aug. 13, 2015

Related U.S. Application Data

(63) Continuation of application No. PCT/JP2012/006901, filed on Oct. 26, 2012.

(51) Int. Cl.
*G03F 7/20* (2006.01)
*G02B 27/28* (2006.01)
(Continued)

(52) U.S. Cl.
CPC ....... *G03F 7/70191* (2013.01); *G02B 5/3016* (2013.01); *G02B 5/3033* (2013.01);
(Continued)

(58) Field of Classification Search
CPC .. G02B 5/3016; G02B 5/3033; G02B 27/288; G03F 7/70191; G03F 1/38; G03F 7/0035; B29C 59/16; B29D 11/00644
(Continued)

(56) References Cited

U.S. PATENT DOCUMENTS 5,327,285 A * 7/1994 Faris ................ G02B 27/0093
                                                348/E5.141
6,624,863 B1 * 9/2003 Jacobs ................ G02B 5/3016
                                                348/E13.022
(Continued)

FOREIGN PATENT DOCUMENTS

| CN | 102629080 A | 8/2012 |
| JP | 2010-91906 A | 4/2010 |
| JP | 2012-159713 A | 8/2012 |

OTHER PUBLICATIONS

International Preliminary Report on Patentability for International Application No. PCT/JP2012/006901, issued by the International Bureau of WIPO dated May 7, 2015.
(Continued)

*Primary Examiner* — Frant Font

(57) ABSTRACT

Provided is an exposure apparatus including a transporting section; a first polarized light output section that outputs first polarized light; a second polarized light output section that outputs second polarized light; a first mask section that has formed therein a first aperture section that passes the first polarized light for exposing an orientation film and blocks the first polarized light; and a second mask section that has formed therein a second aperture section that passes the second polarized light for exposing the orientation film and blocks the second polarized light. The first aperture section and the second aperture section are formed to expose a certain region of the orientation film in an overlapping manner.

12 Claims, 23 Drawing Sheets

(51) Int. Cl.
*G03F 1/38* (2012.01)
*G02B 5/30* (2006.01)
*G02F 1/1337* (2006.01)
*G03F 7/00* (2006.01)

(52) U.S. Cl.
CPC ..... *G02B 27/288* (2013.01); *G02F 1/133788* (2013.01); *G03F 1/38* (2013.01); *G03F 7/0035* (2013.01)

(58) Field of Classification Search
USPC ........................ 359/486.02; 355/74; 264/1.34
See application file for complete search history.

(56) References Cited

U.S. PATENT DOCUMENTS

| | | |
|---|---|---|
| 2011/0217638 A1 | 9/2011 | Kim et al. |
| 2012/0212714 A1* | 8/2012 | Choi .................... G02B 5/3083 355/53 |
| 2014/0199528 A1* | 7/2014 | Nishimura ........... G02B 5/3083 428/195.1 |
| 2015/0008601 A1* | 1/2015 | Kakubari ............ G02F 1/13363 264/1.34 |

OTHER PUBLICATIONS

Office Action issued for counterpart Taiwanese Application 102137414, issued by the Taiwan Intellectual Property Office dated Sep. 8, 2015.
Hubert Seiberle, et al., "Photo-Aligned Anisotropic Optical Thin Films," SID Symposium Digest of Technical Papers, U.S., Society for Information Display, Jul. 5, 2012, vol. 34, Issue 1, pp. 1162-1165.
International Search Report for International Application No. PCT/JP2012/006901, issued by the Japanese Patent Office dated Feb. 5, 2013.

* cited by examiner

EXPOSURE APPARATUS, MASK, AND OPTICAL FILM

BACKGROUND

The contents of the following International patent application are incorporated herein by reference: No. PCT/JP2012/006901.

1. Technical Field

The present invention relates to an exposure apparatus, a mask, and an optical film.

2. Related Art

An exposure apparatus is known that uses a mask to expose a plurality of regions of an orientation film with different polarized light, as shown in Patent Document 1 and Non-Patent Document 1, for example. Patent Document 1: US Patent Application Publication No. 2011/0217638
Non-patent Document 1: Hubert Seiberle, et al., "Photo-Aligned Anisotropic Optical Thin Films," SID Symposium Digest of Technical Papers, U.S., Society for Information Display, Jul. 5, 2012, Volume 34, Issue 1, pp. 1162-1165

However, in the exposure apparatus described above, the number of patterns increases when forming a complicated pattern, and therefore the configuration of the exposure apparatus also becomes complicated.

SUMMARY

According to a first aspect of the present invention, provided is an exposure apparatus comprising a transporting section that transports a substrate with an orientation film formed thereon in a transport direction; a first polarized light output section that faces toward the orientation film of the substrate and outputs first polarized light having a first polarization direction; a second polarized light output section that is arranged downstream from the first polarized light output section in the transport direction, faces toward the orientation film of the substrate, and outputs second polarized light having a second polarization direction that intersects the first polarization direction at an angle of less than 90 degrees; a first mask section that is arranged between the substrate and the first polarized light output section, has formed therein a first aperture section that passes the first polarized light for exposing the orientation film, and blocks the first polarized light; and a second mask section that is arranged between the substrate and the second polarized light output section, has formed therein a second aperture section that passes the second polarized light for exposing the orientation film, and blocks the second polarized light. The first aperture section and the second aperture section are formed to expose a certain region of the orientation film in an overlapping manner, the first aperture section has a first aperture region that passes the first polarized light toward the certain region, and the second aperture section has a second aperture region that passes the second polarized light toward the certain region.

According to a second aspect of the present invention, provided is a mask that is arranged in optical paths of first polarized light and second polarized light output to a substrate on which an orientation film is formed, where the second polarized light intersects the first polarized light at an angle of less than 90 degrees, the mask comprising a first mask section that is arranged in the optical path of the first polarized light, has formed therein a first aperture section that passes the first polarized light, and blocks the first polarized light; and a second mask section that is arranged in the optical path of the second polarized light, has formed therein a second aperture section that passes the second polarized light, and blocks the second polarized light. The first aperture section and the second aperture section are formed to expose a certain region of the orientation film in an overlapping manner, the first aperture section has a first aperture region that passes the first polarized light toward the certain region, and the second aperture section has a second aperture region that passes the second polarized light toward the certain region.

According to a third aspect of the present invention, provided is an optical film manufactured through exposure using the exposure apparatus according to the exposure apparatus described above.

The summary clause does not necessarily describe all necessary features of the embodiments of the present invention. The present invention may also be a sub-combination of the features described above.

BRIEF DESCRIPTION OF THE DRAWINGS

FIG. 23 is a planar view of an optical film 2300 functioning as a low-pass filter used in an image capturing device or the like.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
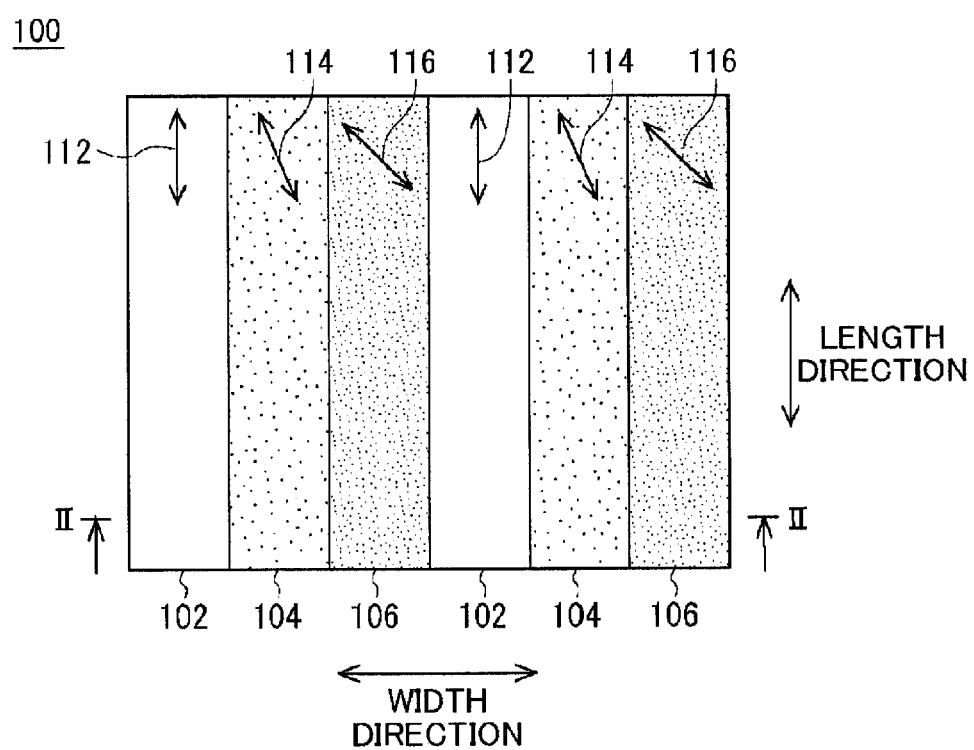
FIG. 1 is a planar view of an optical film 100 manufactured by an exposure apparatus according to an embodiment of the present invention.

FIG. 1 is a planar view of an optical film 100 manufactured by an exposure apparatus according to an embodiment of the present invention. In FIG. 1, the length direction and width direction indicated by the arrows correspond to the length direction and width direction of the optical film 100. The length of the optical film 100 in the length direction may be less than the length of the optical film 100 in the width direction.

The optical film 100 is formed as a square with an edge length from several centimeters to several meters. As shown in FIG. 1, the optical film 100 includes a plurality of first polarization modulating sections 102, a plurality of second polarization modulating sections 104, and a plurality of third polarization modulating sections 106.

The first polarization modulating sections 102, the second polarization modulating sections 104, and the third polarization modulating sections 106 are formed to have substantially the same shape in a planar view. The first polarization modulating sections 102, the second polarization modulating sections 104, and the third polarization modulating sections 106 are formed as rectangles extending in the length direction. The first polarization modulating sections 102, the second polarization modulating sections 104, and the third polarization modulating sections 106 are formed such that the edges thereof contact each other. The first polarization modulating sections 102, the second polarization modulating sections 104, and the third polarization modulating sections 106 are arranged periodically in the width direction, in the stated order. This arrangement direction, for example, may be changed as desired. In the example of FIG. 1, two of each of the first polarization modulating sections 102, the second polarization modulating sections 104, and the third polarization modulating sections 106 are formed, but three or more of each may be formed instead.

The first polarization modulating sections 102, the second polarization modulating sections 104, and the third polarization modulating sections 106 are formed such that light can pass therethrough. The modulating sections 102, the second polarization modulating sections 104, and the third polarization modulating sections 106 modulate the polarization state of polarized light passing therethrough. The modulating sections 102, the second polarization modulating sections 104, and the third polarization modulating sections 106 have the retardation function of a half-wave plate. The first polarization modulating sections 102, the second polarization modulating sections 104, and the third polarization modulating sections 106 may instead have the retardation function of a quarter-wave plate.

The first polarization modulating sections 102 each have an optical axis parallel to the length direction, such as shown by the arrows 112 recorded at the top of FIG. 1, for example. The example of this optical axis is a slow axis or a fast axis. In this way, each first polarization modulating section 102 modulates incident light to be linearly polarized light in which the polarization direction of the incident linearly polarized light has been changed to a polarization direction that is linearly symmetrical, with the optical axis of the first polarization modulating section 102 as the axis of symmetry, and emits the resulting polarized light.

The optical axes of the second polarization modulating sections 104 are formed in a direction differing from the optical axes of the first polarization modulating sections 102. The direction of the optical axes of the second polarization modulating sections 104 is parallel to a direction rotated by 22.5 degrees from the length direction, i.e. the direction of the optical axes of the first polarization modulating sections 102, as shown by the arrows 114 recorded at the top of FIG. 1. The optical axes of the third polarization modulating sections 106 are formed in a direction differing from the direction of the optical axes of the first polarization modulating sections 102 and the second polarization modulating sections 104. The direction of the optical axes of the third polarization modulating sections 106 is parallel to a direction rotated by 45 degrees from the direction of the optical axes of the first polarization modulating sections 102, in the same direction as the rotation of the optical axes of the second polarization modulating sections 104, as shown by the arrows 116 recorded at the top of FIG. 1. In other words, the optical axis of the optical film 100 including the first polarization modulating sections 102, the second polarization modulating sections 104, and the third polarization modulating sections 106 changes in a stepped manner in the width direction. The second polarization modulating sections 104 and the third polarization modulating sections 106 modulate incident light to be linearly polarized light in which the polarization direction of the incident linearly polarized light has been changed to a polarization direction that is linearly symmetrical, with their respective optical axes as the axes of symmetry, and emit the resulting polarized light.

As a result, when linearly polarized light having a single polarization direction is incident to the first polarization modulating sections 102, the second polarization modulating sections 104, and the third polarization modulating sections 106, the linearly polarized light output respectively by the first polarization modulating sections 102, the second polarization modulating sections 104, and the third polarization modulating sections 106 has different polarization directions.

Figure 2:
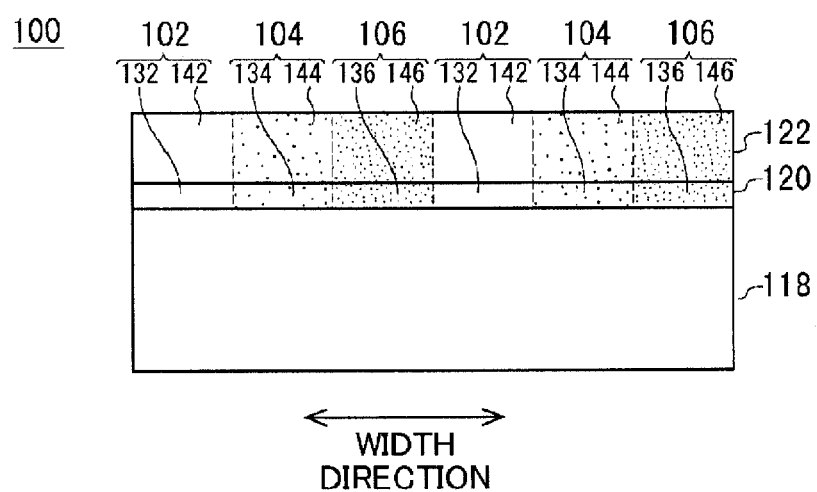
FIG. 2 is a cross-sectional view of the optical film 100 along the line II-II in FIG. 1.

FIG. 2 is a cross-sectional view of the optical film 100 along the line II-II in FIG. 1. As shown in FIG. 2, the optical film 100 includes a resin substrate 118, an orientation film 120, and a liquid crystal film 122.

The resin substrate 118 is formed by cleaving an elongated resin film, which is described further below, to have a prescribed length. The resin substrate 118 passes light. The thickness of the resin substrate 118 is from 50 μm to 100 μm. The resin substrate 118 supports the first polarization modulating sections 102, the second polarization modulating sections 104, and the third polarization modulating sections 106. The resin substrate 118 can be formed by a cycloolefin type film. As another example, the resin substrate 118 may be formed by a material including triacetylcellulose (TAC). The TAC film can be FujiTAC T80SZ or TD80UL manufactured by Fujifilm Corporation, for example.

The orientation film 120 is formed on the surface of the resin substrate 118. The orientation film 120 can use a widely known photoalignment compound. The photoalignment compound is a material that, when irradiated with linearly polarized light such as ultraviolet rays, has the molecules therein oriented regularly in the polarization direction of this linearly polarized light. Furthermore, the photoalignment compound has a function to orient the molecules of the liquid crystal film 122 formed thereon in alignment with the orientation of the molecules of the photoalignment compound itself. Examples of a photoalignment compound include photodegradation, photodimerization, and photoisomerization type compounds.

The orientation film 120 includes a plurality of first orientation regions 132, a plurality of second orientation regions 134, and a plurality of third orientation regions 136. The first orientation regions 132, the second orientation regions 134, and the third orientation regions 136 are arranged periodically in the width direction, in the stated order. The first orientation regions 132, the second orientation regions 134, and the third orientation regions 136 are in contact with other first orientation regions 132, second orientation regions 134, and third orientation regions 136 adjacent thereto.

The first orientation regions 132 form a portion of the first polarization modulating sections 102. The first orientation regions 132 are oriented in a direction corresponding to the optical axes of the first polarization modulating sections 102. The second orientation regions 134 form a portion of the second polarization modulating sections 104. The second orientation regions 134 are oriented in a direction corresponding to the optical axes of the second polarization modulating sections 104, which is a direction rotated by 22.5 degrees from the orientation direction of the first orientation regions 132. The third orientation regions 136 form a portion of the third polarization modulating sections 106. The third orientation regions 136 are oriented in a direction corresponding to the optical axes of the third polarization modulating sections 106, which is a direction rotated by 45 degrees from the orientation direction of the first orientation regions 132, in the same direction as the rotation of the orientation direction of the second orientation regions 134.

The liquid crystal film 122 is formed on the orientation film 120. The liquid crystal film 122 can be formed by liquid crystal molecules that can be cured by ultraviolet rays or heating, for example. The liquid crystal film 122 includes first liquid crystal regions 142, second liquid crystal regions 144, and third liquid crystal regions 146. The first liquid crystal regions 142 form a portion of the first polarization modulating sections 102. The first liquid crystal regions 142 are formed on the first orientation regions 132. The molecules of the first liquid crystal regions 142 are oriented in alignment with the orientation of the first orientation regions 132. The second liquid crystal regions 144 form a portion of the second polarization modulating sections 104. The second liquid crystal regions 144 are formed on the second orientation regions 134. The molecules of the second liquid crystal regions 144 are oriented in alignment with the orientation of the second orientation regions 134. The third liquid crystal regions 146 form a portion of the third polarization modulating sections 106. The third liquid crystal regions 146 are formed on the third orientation regions 136. The molecules of the third liquid crystal regions 146 are oriented in alignment with the orientation of the third orientation regions 136.

Figure 3:
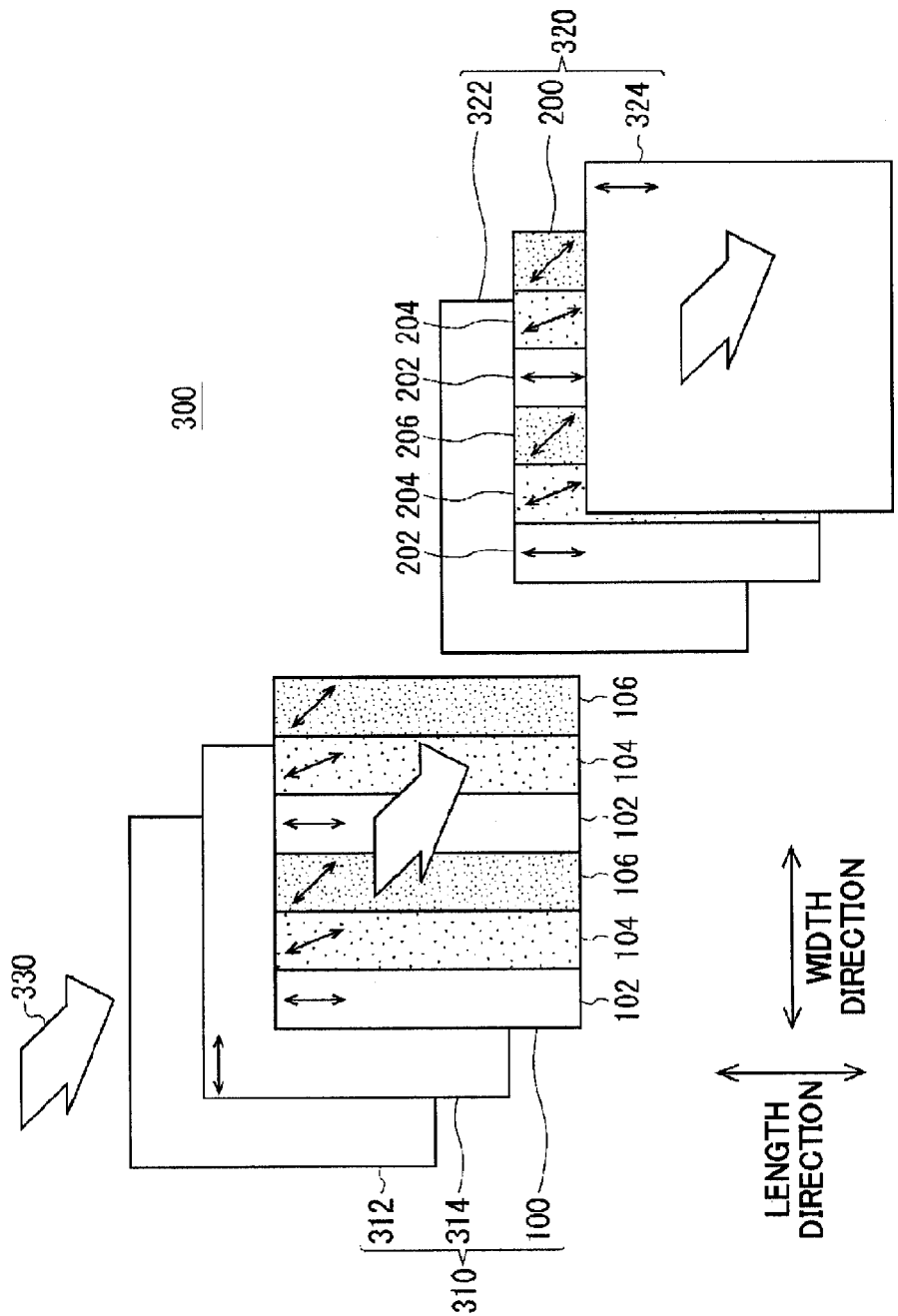
FIG. 3 is an exploded perspective view of a light control window member pair 300 provided with the optical film 100.

FIG. 3 is an exploded perspective view of a light control window member pair 300 provided with the optical film 100. The light control window member pair 300 is provided on a window of a building, for example. As shown in FIG. 3, the light control window member pair 300 includes light control window members 310 and 320. The light control window members 310 and 320 are provided on the window in a manner to be moveable in the width direction. The light control window members 310 and 320 are provided at the same height. The arrow 330 in FIG. 3 indicates the progression direction of the light. As one example, the light is natural light that is incident to a room inside a building from the outside, for example.

The light control window member 310 includes a base plate 312, a polarization plate 314, and the optical film 100. In FIG. 3, the base plate 312, the polarization plate 314, and the optical film 100 are displayed in a shifted manner for ease of explanation. In a state where the light control window member 310 is assembled, the base plate 312, the polarization plate 314, and the optical film 100 are arranged such that the edges thereof match.

The base plate 312 is formed by glass or the like that can pass light.

The polarization plate 314 is provided on a surface of the base plate 312 that is downstream in the light progression direction. The polarization plate 314 has the same shape as the base plate 312. The polarization plate 314 has a transmission axis that is parallel to the width direction. Accordingly, when the natural light that progresses from the outside in the direction of the arrow 330 is incident to the polarization plate 314, the polarization plate 314 emits to the optical film 100 linearly polarized light with a polarization direction in the width direction.

The optical film 100 is provided on a surface of the polarization plate 314 that is downstream in the light progression direction. The optical film 100 has the same shape as the base plate 312. The optical film 100 modulates the polarization direction of the linearly polarized light emitted from the polarization plate 314. The first polarization modulating sections 102, the second polarization modulating sections 104, and the third polarization modulating sections 106 of the optical film 100 have optical axes in respectively different directions, and therefore linearly polarized light having respectively different polarization directions is output.

The light control window member 320 is arranged downstream from the light control window member 310 in the light progression direction. The light control window member 320 can move in the width direction, such that some or all of the light control window member 320 overlaps with the light control window member 310. The light control window member 320 includes a base plate 322, an optical film 200, and a polarization plate 324. The base plate 322, the optical film 200, and the polarization plate 324 have substantially the same shape as the base plate 312.

The base plate 322 has the same configuration as the base plate 312.

The optical film 200 is provided on a surface of the base plate 322 that is downstream in the light progression direction. The optical film 200 includes first polarization modulating sections 202, second polarization modulating sections 204, and third polarization modulating sections 206. The optical film 200 has the same configuration as the optical film 100. Accordingly, the direction of the optical axes of the first polarization modulating sections 202 is parallel to the length direction, and is the same as the direction of the optical axes of the first polarization modulating sections 102. The direction of the optical axes of the second polarization modulating sections 204 is a direction inclined 22.5 degrees from the length direction, and is the same as the direction of the optical axes of the second polarization modulating sections 104. The direction of the optical axes of the third polarization modulating sections 206 is a direction inclined 45 degrees from the length direction, and is the same as the direction of the optical axes of the third polarization modulating sections 106. As a result, when linearly polarized light is incident thereto, the optical film 200 modulates the polarized light and emits the resulting light. The directions of the optical axes of the first polarization modulating sections 202, the second polarization modulating sections 204, and the third polarization modulating sections 206 may be different from the directions of the optical axes of the first polarization modulating sections 102, the second polarization modulating sections 104, and the third polarization modulating sections 106.

The polarization plate 324 is provided downstream from the optical film 200 in the light progression direction. The polarization plate 324 has a transmission axis parallel to the length direction, for example. In other words, the polarization plate 324 has a transmission axis that is orthogonal to the transmission axis of the polarization plate 314. As a result, when light is incident thereto, the polarization plate 324 blocks the component of the light in the width direction and emits linearly polarized light whose polarization direction is the length direction.

If the optical films 100 and 200 are arranged between the polarization plate 314 and the polarization plate 324, the arrangement of the base plate 312 and the base plate 322 may be changed as desired. Furthermore, the base plate 312 and the base plate 322 may be omitted.

Figure 4:
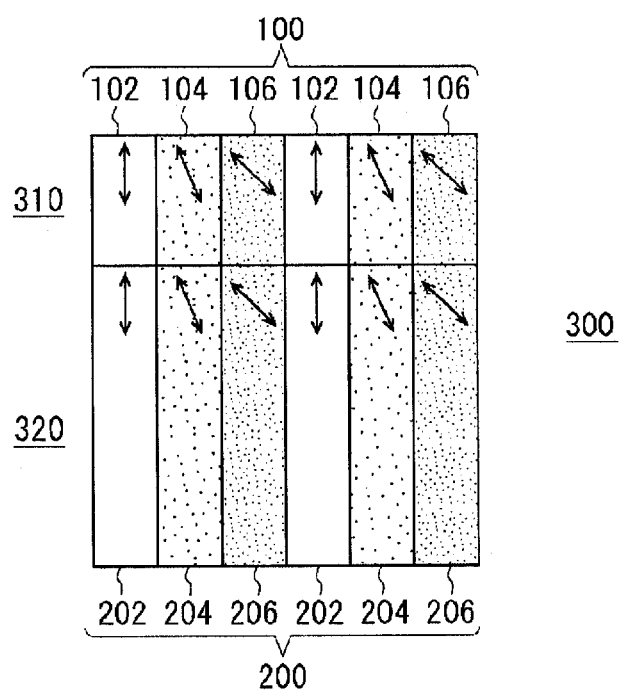
FIG. 4 is used to describe the functions of the light control window member pair 300.
Figure 5:
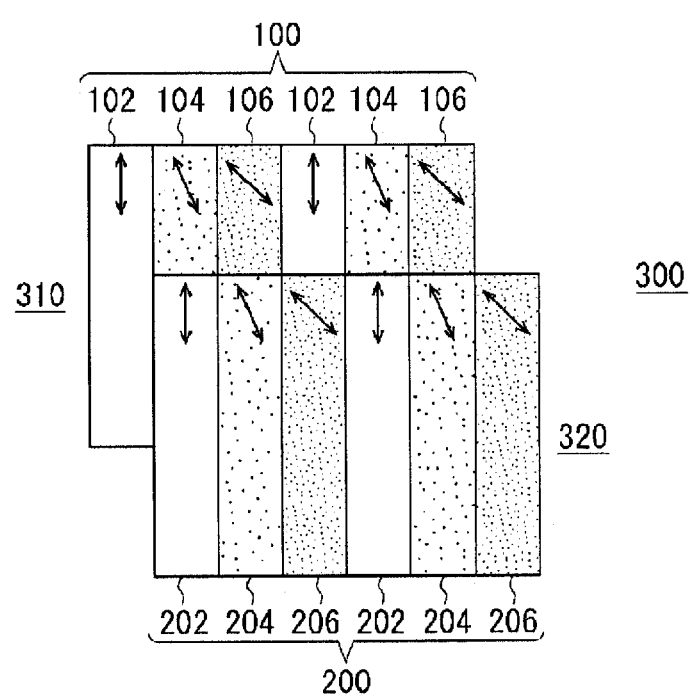
FIG. 5 is used to describe the functions of the light control window member pair 300.

FIGS. 4 and 5 are used to describe the functions of the light control window member pair 300. In FIGS. 4 and 5, for ease of explanation, only the optical films 100 and 200 are recorded. Furthermore, in FIGS. 4 and 5, for ease of explanation, the top and bottom ends of the optical films 100 and 200 are shifted from each other, but these ends match in a state where the light control window member pair 300 is attached to the window.

In the state shown in FIG. 4, the sides of the optical film 100 in the width direction match the sides of the optical film 200 in the width direction. As a result, the entire surface of the optical film 100 overlaps with the entire surface of the optical film 200. Accordingly, the first polarization modulating sections 102, the second polarization modulating sections 104, and the third polarization modulating sections 106 of the optical film 100 respectively overlap with the first polarization modulating sections 202, the second polarization modulating sections 204, and the third polarization modulating sections 206 of the optical film 200.

In this case, the linearly polarized light emitted from the polarization plate 314 whose polarization direction is the width direction has the polarization direction thereof modulated when passing through the first polarization modulating sections 102, the second polarization modulating sections 104, and the third polarization modulating sections 106 of the optical film 100. However, the modulated linearly polarized light is again modulated to become linearly polarized light whose polarization direction is the original width direction, as a result of passing through the first polarization modulating sections 202, the second polarization modulating sections 204, and the third polarization modulating sections 206 of the optical film 200. As a result, the linearly polarized light is blocked by the polarization plate 324. Accordingly, in the state shown in FIG. 4, the light progressing in the direction of the arrow 330 in FIG. 3 is almost completely blocked.

On the other hand, in the state shown in FIG. 5, the sides of the optical films 100 and 200 are shifted relative to each other in the width direction, such that the second polarization modulating sections 104, the third polarization modulating sections 106, and the first polarization modulating sections 102 of the optical film 100 respectively overlap with the first polarization modulating sections 202, the second polarization modulating sections 204, and the third polarization modulating sections 206 of the optical film 200. Accordingly, in regions overlapping each other, the direction of the optical axis of the optical film 100 differs from the direction of the optical axis of the optical film 200.

In this case, the linearly polarized light emitted from the polarization plate 314 whose polarization direction is the width direction is modulated by the second polarization modulating sections 104, the third polarization modulating sections 106, and the first polarization modulating sections 102 of the optical film 100. After this, the modulated linearly polarized light is modulated by the first polarization modulating sections 202, the second polarization modulating sections 204, and the third polarization modulating sections 206 of the optical film 200. In the regions where the optical films 100 and 200 overlap, the optical axis of the optical film 100 and the optical axis of the optical film 200 are in different directions, and therefore the linearly polarized light emitted from the optical film 200 is emitted as linearly polarized light having a polarization direction that is different from the width direction, which is the polarization direction of the linearly polarized light incident to the optical film 100. Accordingly, a portion of the linearly polarized light emitted from the optical film 200 is emitted by passing through the polarization plate 324 whose transmission axis is in the length direction.

As a result, the light control window member pair 300 can adjust the amount of light that is passed by adjusting the overlap of the light control window member 310 and the light control window member 320 to overlap, i.e. by adjusting the relative positions of the light control window member 310 and the light control window member 320 in the width direction.

Figure 6:
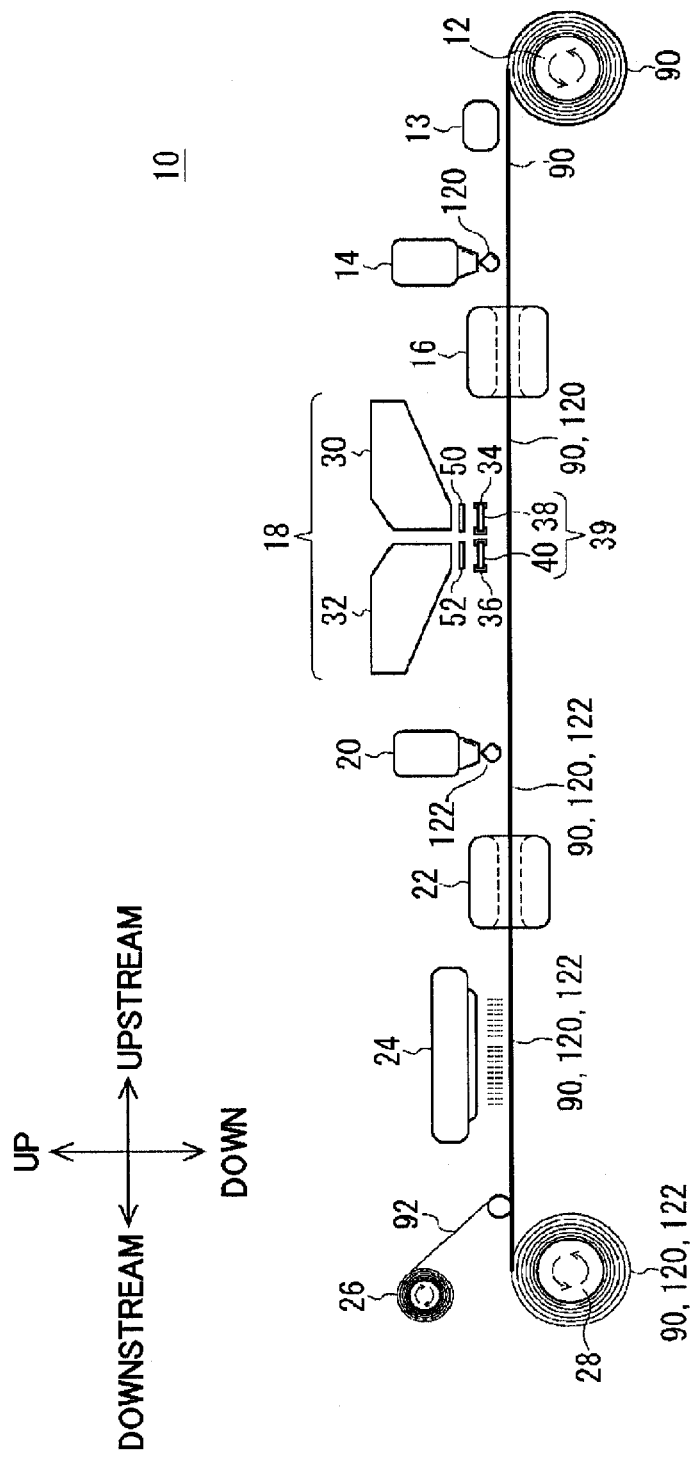
FIG. 6 shows the overall configuration of the exposure apparatus 10.
Figure 7:
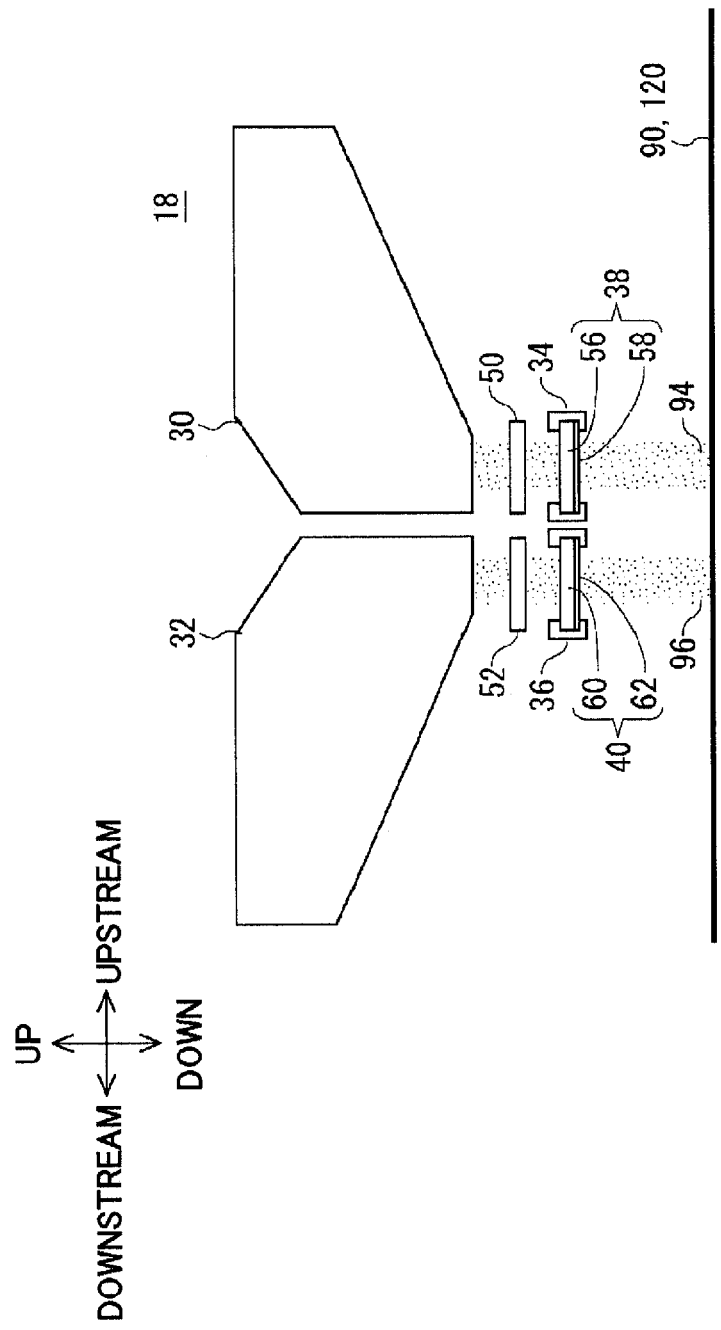
FIG. 7 is an enlarged view of the exposing section 18.

FIG. 6 shows the overall configuration of the exposure apparatus 10. FIG. 7 is an enlarged view of the exposing section 18. The up and down directions indicated by the arrows in FIG. 6 are the up and down directions of the exposure apparatus 10. Furthermore, the upstream and downstream directions refer to upstream and downstream directions in the transport direction. The transport direction is the same direction as the length direction of the sheet resin substrate 90, and is orthogonal to the width direction. The sheet resin substrate 90 is the rectangular resin substrate 118 prior to the cleaving. The sheet resin substrate 90 is an example of a substrate.

As shown in FIGS. 6 and 7, the exposure apparatus 10 includes a feeding roller 12, a cleaning section 13, an orientation film applying section 14, an orientation film drying section 16, an exposing section 18, a liquid crystal film applying section 20, a liquid crystal film orienting section 22, a liquid crystal film curing section 24, a film supplying section 26, and a winding roller 28.

The feeding roller 12 is arranged furthest upstream in the transport path of the sheet resin substrate 90. The sheet resin substrate 90 to be supplied is wound around the outside of the feeding roller 12. The feeding roller 12 is supported in a manner to be rotatable. In this way, the feeding roller 12 can support the sheet resin substrate 90 in a manner that allows feeding of the sheet resin substrate 90. The feeding roller 12 may be formed by a driving mechanism such as a motor in a manner to be rotatable, or may be formed in a manner to move in accordance with the rotation of the winding roller 28. As another example, a mechanism may be provided to drive the sheet resin substrate 90 in the transport path.

The cleaning section 13 is arranged between the feeding roller 12 and the orientation film applying section 14. The cleaning section 13 cleans the sheet resin substrate 90 that is fed from the feeding roller 12, before the orientation film 120 is applied. It should be noted that the cleaning section 13 may be omitted.

The orientation film applying section 14 is arranged downstream from the feeding roller 12 and upstream from the exposing section 18. The orientation film applying section 14 is arranged above the transport path of the sheet resin substrate 90 being transported. The orientation film applying section 14 supplies the orientation film 120 in an unoriented and liquid state, and applies this orientation film 120 on the top surface of the sheet resin substrate 90. The unoriented orientation film 120 may be a liquid that includes orientation film molecules, for example.

The orientation film drying section 16 is arranged downstream from the orientation film applying section 14. The orientation film drying section 16 uses heat, light irradiation, wind power, or the like to evaporate and dry the solvent of the orientation film 120 applied on the sheet resin substrate 90 passing therethrough.

The exposing section 18 is arranged downstream from the orientation film drying section 16. The exposing section 18 includes light sources 30 and 32, a first polarized light output section 50, a second polarized light output section 52, mask holding sections 34 and 36, and a mask 39 having a first mask 38 and a second mask 40. The exposing section 18 causes the light output from the light sources 30 and 32 to be linearly polarized light, by using a first polarized light output section 50 and a second polarized light output section 52. The exposing section 18 irradiates the orientation film 120 applied on the sheet resin substrate 90 with this linearly polarized light through the first mask 38 and the second mask 40, thereby exposing the orientation film 120. In this way, the exposing section 18 orients the orientation film 120.

The light sources 30 and 32 are arranged above the transport path of the sheet resin substrate 90. The light sources 30 and 32 is arranged between the orientation film applying section 14 and the liquid crystal film applying section 20. The light source 32 is arranged downstream from the light source 30. The light sources 30 and 32 output ultraviolet rays with the same illuminance. This illuminance refers to the energy per unit area of the output light, and uses units of mW/cm².

The first polarized light output section 50 and the second polarized light output section 52 are arranged respectively under the light sources 30 and 32. The first polarized light output section 50 and the second polarized light output section 52 are Brewster plates, for example. When light from the light source 30 is incident to the first polarized light output section 50, the first polarized light output section 50 outputs first polarized light 94 having a polarization direction corresponding to the orientation of the first orientation region 132. When light from the light source 32 is incident to the second polarized light output section 52, the second polarized light output section 52 outputs second polarized light 96 having a polarization direction corresponding to the orientation of the third orientation region 136. The polarization direction of the second polarized light 96 output by the second polarized light output section 52 is different from the polarization direction of the first polarized light 94 output by the first polarized light output section 50, and intersects the polarization direction of the first polarized light 94. The polarization direction of the first polarized light 94 is parallel to the transport direction, for example. The angle of intersection between the polarization direction of the second polarized light 96 and the polarization direction of the first polarized light 94 is 45 degrees, for example. The polarization direction of the second polarized light 96 output by the second polarized light output section 52 and the polarization direction of the first polarized light 94 output by the first polarized light output section 50 may intersect at any angle.

The first polarized light output section 50 outputs the first polarized light 94 to the orientation film 120 of the sheet resin substrate 90 transported therebelow. The second polarized light output section 52 outputs the second polarized light 96 to the orientation film 120 of the sheet resin substrate 90 transported therebelow. The light source 32 and the second polarized light output section 52 is arranged downstream from the light source 30 and the first polarized light output section 50 in the transport direction. Therefore, the second polarized light 96 reaches the orientation film 120 on the sheet resin substrate 90 at a position further downstream than the first polarized light 94 in the transport direction.

The first polarized light output section 50 outputs the first polarized light 94 to be incident in a manner substantially perpendicular to the sheet resin substrate 90. Furthermore, the second polarized light output section 52 outputs the second polarized light 96 to be incident in a manner substantially perpendicular to the sheet resin substrate 90. Instead, the first polarized light output section 50 and the second polarized light output section 52 may cause the first polarized light 94 and the second polarized light 96 to be incident at an angle inclined relative to the sheet resin substrate 90. In this way, even if the first polarized light 94 and the second polarized light 96 are reflected by surrounding equipment or the like after being reflected by the sheet resin substrate 90, the light is restricted from returning to the orientation film 120 applied on the sheet resin substrate 90. As a result, the reflected first polarized light 94 and second polarized light 96 can be restricted from irradiating unexpected locations on the orientation film 120 and disturbing the orientation.

The illuminance of the ultraviolet light output by the light sources 30 and light source 32, which is the same for both the light source 30 and the light source 32 in units of mW/cm², may be greater than or equal to 45 mW/cm², for example. It should be noted that the method of exposure may be changed as desired. For example, the first polarized light output section 50 and the second polarized light output section 52 may radiate the first polarized light 94 and the second polarized light 96 at an angle inclined relative to the up and down direction. The up and down direction referred to here is the up and down direction indicated by the arrows in FIG. 6.

A light blocking wall extending in the vertical direction is preferably provided from a position between the first polarized light output section 50 and the second polarized light output section 52 to a position between the first mask 38 and the second mask 40. As a result, the light blocking wall blocks the different types of polarized light from each other. In this case, the light blocking wall is preferably colored black in order to restrict reflection of the first polarized light 94 and the second polarized light 96.

The mask holding section 34 is arranged in the optical path of the first polarized light 94, between the first polarized light output section 50 and the sheet resin substrate 90. The mask holding section 34 holds the first mask 38. The mask holding section 36 is arranged in the optical path of the second polarized light 96, between the second polarized light output section 52 and the sheet resin substrate 90. The mask holding section 36 holds the second mask 40.

The mask holding section 34 and the mask holding section 36 are held independently and in a manner to be movable relative to the sheet resin substrate 90 in the width direction that is orthogonal to the transport direction. In this way, the first mask 38 and the second mask 40 move together with the mask holding section 34 and the mask holding section 36 due to a motor or actuator, for example, to have the positions of the first mask 38 and the second mask 40 adjusted independently in the width direction.

The first mask 38 is held by the mask holding section 34 between the first polarized light output section 50 and the sheet resin substrate 90. As an example, the first mask 38 is arranged hundreds of µm above the sheet resin substrate 90. In this way, the first mask 38 is arranged in the optical path of the first polarized light 94. The first mask 38 includes a first mask substrate 56 and a first mask section 58, which are described further below.

The second mask 40 is held by the mask holding section 36 between the second polarized light output section 52 and the sheet resin substrate 90. As an example, the second mask 40 is arranged hundreds of µm above the sheet resin substrate 90. In this way, the second mask 40 is arranged in the optical path of the second polarized light 96. The second mask 40 is arranged downstream from the first mask 38. The second mask 40 includes a second mask substrate 60 and a second mask section 62, which are described further below.

The liquid crystal film applying section 20 is arranged downstream from the exposing section 18. The liquid crystal film applying section 20 is arranged above the transport path of the sheet resin substrate 90. The liquid crystal film applying section 20 supplies the liquid crystal film 122 in an unoriented and liquid state, and applies this liquid crystal film 122 on the orientation film 120 formed on the sheet resin substrate 90. The unoriented liquid crystal film 122 may be a butyl acetate solvent, for example.

The liquid crystal film orienting section 22 is arranged downstream from the liquid crystal film applying section 20. The liquid crystal film orienting section 22 uses heat, light irradiation, wind power, or the like to evaporate and dry the solvent while the liquid crystal film 122 formed on the orientation film 120 passing therethrough is oriented in alignment with the orientation direction of the orientation film 120.

The liquid crystal film curing section 24 is arranged downstream from the liquid crystal film orienting section 22. The liquid crystal film curing section 24 cures the liquid crystal film 122 through irradiation with ultraviolet rays. In this way, the orientation of the molecules of the liquid crystal film 122 oriented in alignment with the orientation of the orientation film 120 is fixed.

The film supplying section 26 is arranged between the liquid crystal film curing section 24 and the winding roller 28. The film supplying section 26 supplies a separation film 92 on the liquid crystal film 122 on the sheet resin substrate 90, and affixes the separation film 92 to the liquid crystal film 122. The separation film 92 enables easy separation between the layers of the wound sheet resin substrate 90. It should be noted that the film supplying section 26 may be omitted. Furthermore, the film supplying section 26 may supply a polarized film that functions as the polarization plate 314, instead of the separation film 92. In this way, the process of manufacturing the optical film 100 can be simplified.

The winding roller 28 is an example of a transporting section. The winding roller 28 is arranged downstream from the liquid crystal film curing section 24 and furthest downstream in the transport path. The winding roller 28 is supported in a manner to be rotatably driven. The winding roller 28 winds the sheet resin substrate 90 on which the orientation film 120 and the liquid crystal film 122 are formed. In this way, the winding roller 28 transports the sheet resin substrate 90 on which the unoriented and oriented orientation film 120 is formed in the transport direction.

Figure 8:
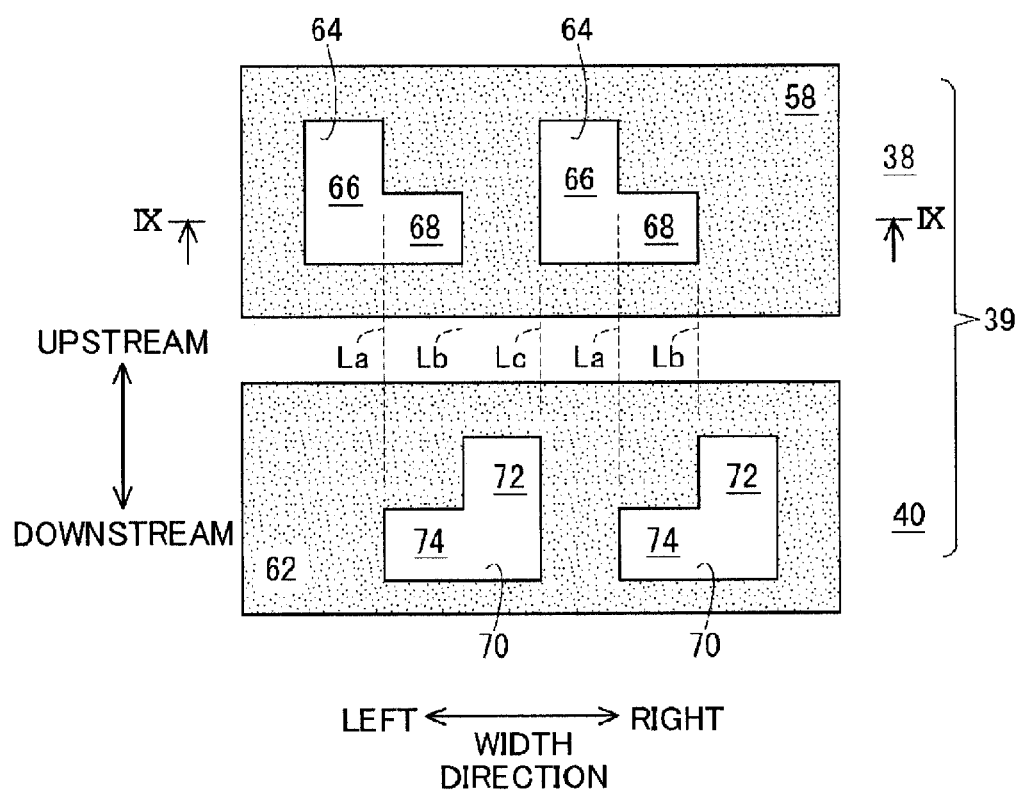
FIG. 8 shows the bottom surface of the mask 39.
Figure 9:
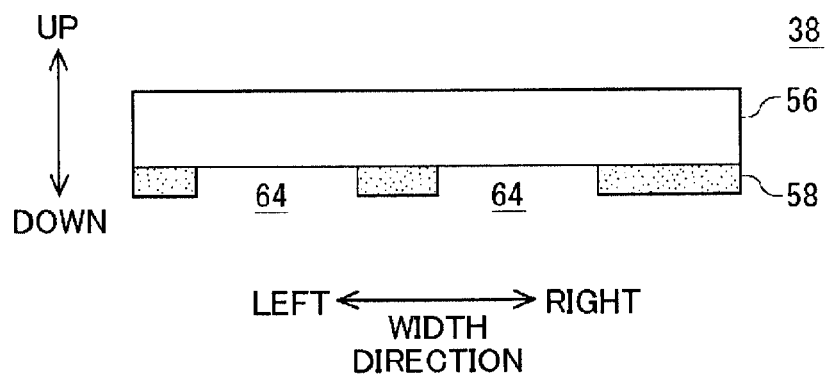
FIG. 9 is a vertical cross-sectional view of the first mask 38 taken along the line IX-IX in FIG. 8.

FIG. 8 is a bottom surface view of the mask 39. FIG. 9 is a vertical cross-sectional view of the first mask 38 taken along the line IX-IX in FIG. 8. As shown in FIG. 8, the width direction is an example of an orthogonal direction that is orthogonal to the transport direction.

As shown in FIGS. 8 and 9, the first mask 38 includes the first mask substrate 56 and the first mask section 58. The second mask 40 includes the second mask substrate 60 and the second mask section 62.

The first mask substrate 56 and the second mask substrate 60 are formed as rectangular boards. The first mask substrate 56 and the second mask substrate 60 are formed of quartz glass with a thermal expansion coefficient of $5.6 \times 10^{-7}/° C$. The first mask substrate 56 and the second mask substrate 60 may be formed by soda lime glass with a thermal expansion coefficient of $85 \times 10^{-7}/° C$. The length of the first mask substrate 56 and the second mask substrate 60 in the transport direction is tens of millimeters. The length of the first mask substrate 56 and the second mask substrate 60 in the width direction is set as desired in accordance with the width of the sheet resin substrate 90.

The first mask section 58 is formed on the bottom surface of the first mask substrate 56. The first mask section 58 is arranged between the first polarized light output section 50 and the sheet resin substrate 90. The first mask section 58 is formed from a material such as chrome oxide that can occlude light contained in the first polarized light 94. A plurality of first aperture sections 64, e.g. two first aperture sections 64, are formed in the first mask section 58. Each first aperture section 64 is arranged in the optical path of the first polarized light 94. Each first aperture section 64 passes the first polarized light 94. Accordingly, the orientation film 120 in the region passing below the first aperture section 64 is oriented by the first polarized light 94. The first aperture sections 64 are formed to have an L shape in a planar view. Each first aperture section 64 includes a first aperture elongated portion 66 and a first aperture shortened portion 68 that has a different length than the first aperture elongated portion 66 in the transport direction. The first aperture shortened portion 68 is an example of a first aperture region. The first aperture elongated portion 66 and the first aperture shortened portion 68 are formed with rectangular shapes. The width of the first aperture elongated portion 66 in the width direction is equal to the width of the first aperture shortened portion 68. The first aperture elongated portion 66 is formed at a different position than the first aperture shortened portion 68 in the width direction. Accordingly, the first aperture elongated portion 66 is formed at a position in the width direction that does not overlap with the first aperture shortened portion 68. The first aperture elongated portion 66 is formed integrally or continuously with the first aperture shortened portion 68. The length of the first aperture elongated portion 66 in the transport direction is greater than the length of the first aperture shortened portion 68. Accordingly, the first aperture section 64 has a length in the transport direction that becomes smaller in a stepped manner in a left and right direction of the width direction. For example, the length of the first aperture elongated portion 66 is approximately double the length of the first aperture shortened portion 68.

The second mask section 62 is formed on the bottom surface of the second mask substrate 60. The second mask section 62 is arranged between the second polarized light output section 52 and the sheet resin substrate 90. The second mask section 62 is formed from a material such as chrome oxide that can occlude light contained in the second polarized light 96. A plurality of second aperture sections 70, e.g. two second aperture sections 70, are formed in the second mask section 62. The second aperture sections 70 are arranged in the optical path of the second polarized light 96. The second aperture sections 70 pass the second polarized light 96. Accordingly, the orientation film 120 in the region passing below the second aperture sections 70 is oriented by the second polarized light 96. The second aperture sections 70 are formed to have an L shape in a planar view. Each second aperture section 70 includes a second aperture elongated portion 72 and a second aperture shortened portion 74 that has a different length than the second aperture elongated portion 72 in the transport direction. The second aperture shortened portion 74 is an example of a second aperture region. The second aperture elongated portion 72 and the second aperture shortened portion 74 are formed with rectangular shapes. The width of the second aperture elongated portion 72 in the width direction is equal to the width of the second aperture shortened portion 74. The second aperture elongated portion 72 is formed at a different position than the second aperture shortened portion 74 in the width direction. Accordingly, the second aperture elongated portion 72 is formed at a position in the width direction that does not overlap with the second aperture shortened portion 74. The second aperture elongated portion 72 is formed integrally or continuously with the second aperture shortened portion 74. Accordingly, the second aperture section 70 has a length in the transport direction that becomes smaller in a stepped manner in a left and right direction of the width direction. The length of the second aperture elongated portion 72 in the transport direction is greater than the length of the second aperture shortened portion 74. For example, the length of the second aperture elongated portion 72 is approximately double the length of the second aperture shortened portion 74.

The widths of the first aperture elongated portion 66, the first aperture shortened portion 68, the second aperture elongated portion 72, and the second aperture shortened portion 74 in the width direction are equal to each other, and are also equal to the widths of the first polarization modulating sections 102, the second polarization modulating sections 104, and the third polarization modulating sections 106 of the optical film 100. The length of the first aperture elongated portion 66 in the transport direction is equal to the length of the second aperture elongated portion 72. The length of the first aperture shortened portion 68 in the transport direction is less than the length of the second aperture shortened portion 74 in the transport direction, at the same position in the width direction.

The first mask section 58 and the second mask section 62 determine the exposure amount by which the orientation film 120 is exposed to the first polarized light 94 and the second polarized light 96, according to the length of the first aperture section 64 in the transport direction and the length of the second aperture section 70 in the transport direction. The exposure amount referred to here is the total amount of energy of the first polarized light 94 and the second polarized light 96 radiated per unit area. The exposure amount E can be expressed as shown below. The units for the exposure amount are mJ/cm². As described above, the first polarized light 94 and the second polarized light 96 have the same illumination.

$$E = (\text{polarized light illuminance} \times \text{aperture length}) / \text{transport speed}$$

As shown by the dotted lines La and Lc in FIG. 8, the first aperture elongated portion 66 is formed at a different position than the second aperture section 70 in the width direction. Accordingly, the region of the orientation film 120 passing below the first aperture elongated portion 66 is oriented by being exposed to the first polarized light 94 passing through the first aperture elongated portion 66.

As shown by the dotted lines Lb and Lc, the second aperture elongated portion 72 is formed at a different position than the first aperture section 64 in the width direction. Accordingly, the region of the orientation film 120 passing below the second aperture elongated portion 72 is oriented by being exposed to the second polarized light 96 passing through the second aperture elongated portion 72.

The length of the first aperture elongated portion 66 in the transport direction is equal to the length of the second aperture elongated portion 72. Accordingly, the exposure amount of the first polarized light 94 to which the region of the orientation film 120 below the first aperture elongated portion 66 is exposed is the same as the exposure amount of the second polarized light 96 to which the region of the orientation film 120 passing below the second aperture elongated portion 72 is exposed.

As shown by the dotted lines La and Lb, the first aperture shortened portion 68 is formed at the same position as the second aperture shortened portion 74 in the width direction. Accordingly, the region of the orientation film 120 passing below the first aperture shortened portion 68 and the second aperture shortened portion 74 is oriented by being exposed to the first polarized light 94 passed by the first aperture shortened portion 68 and the second polarized light 96 passed by the second aperture shortened portion 74. The region of the orientation film 120 exposed to both the first polarized light 94 passed by the first aperture shortened portion 68 and the second polarized light 96 passed by the second aperture shortened portion 74 is an example of a double exposure region. As a result, when the first aperture shortened portion 68 passes the first polarized light toward the double exposure region and the second aperture shortened portion 74 passes the second polarized light toward the double exposure region, the double exposure region of the orientation film 120 is first oriented by the first polarized light 94 and is then oriented by the second polarized light 96 rotating the orientation direction.

In a region in the width direction where both the first aperture section 64 and the second aperture section 70 are formed, i.e. a region where both the first aperture shortened portion 68 and the second aperture shortened portion 74 are formed, the exposure amount of the first polarized light 94 and the exposure amount of the second polarized light 96 are determined according to the respective lengths of the first aperture shortened portion 68 and the second aperture shortened portion 74. Here, the length of the first aperture section 64 and the length of the second aperture section 70 are different at the same position in the width direction. Specifically, at the same position in the width direction, the length of the first aperture shortened portion 68 is less than the length of the second aperture shortened portion 74. Furthermore, the illuminance of the first polarized light 94 is the same as the illuminance of the second polarized light

96. Accordingly, in the region that is exposed to both the first polarized light 94 and the second polarized light 96, the exposure amount of the first polarized light 94 is less than the exposure amount of the second polarized light 96.

The following describes the orientation direction of the region of the orientation film 120 exposed to both the first polarized light 94 and the second polarized light 96.

Figure 10:
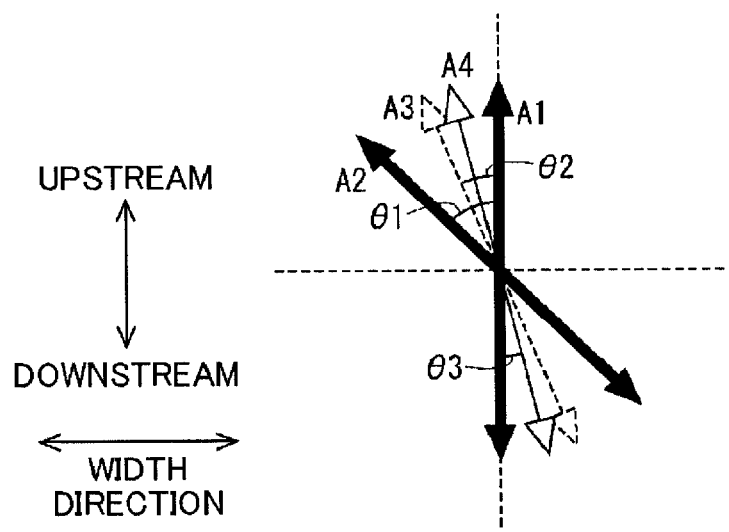
FIG. 10 is used to describe the orientation direction of the orientation film 120 in a case where the first polarized light 94 and the second polarized light 96 have the same exposure amount.

FIG. 10 is used to describe the orientation direction of the orientation film 120 in a case where the first polarized light 94 and the second polarized light 96 have the same exposure amount. The direction of the arrow A1 in FIG. 10 indicates the polarization direction of the first polarized light 94. The direction of the arrow A1 is parallel to the transport direction. The length of the arrow A1 indicates the exposure amount E1 of the first polarized light 94. The direction of the arrow A2 indicates the polarization direction of the second polarized light 96. The angle $\theta_1$ between the arrow A1 and the arrow A2 is 45 degrees. The length of the arrow A2 indicates the exposure amount E2 of the second polarized light 96. In the example of FIG. 10, E1=E2, i.e. the length of the arrow A1 is the same as the length of the arrow A2.

When the orientation film 120 is exposed to the first polarized light 94 shown by the arrow A1, the orientation film 120 is oriented in alignment with the direction of the arrow A1. Furthermore, when the orientation film 120 is exposed to the second polarized light 96 shown by the arrow A2, the orientation film 120 is oriented in alignment with the direction of the second arrow A2.

After being exposed to the first polarized light 94 shown by the arrow A1, when the orientation film 120 is exposed to the second polarized light 96 shown by the arrow A2, the orientation direction in alignment with the polarization direction of the first polarized light 94 is rotated in the polarization direction of the second polarized light 96. Accordingly, the orientation film 120 is oriented in a direction between the directions of the arrow A1 and the arrow A2. However, when the exposure amounts E1 and E2 are equal, the region of the orientation film 120 exposed to both the first polarized light 94 and the second polarized light 96 is not oriented in the direction of the arrow 3A with an angle of $\theta_2$ (=22.5 degrees) relative to the arrow A1, i.e. not in the direction of the arrow A3 in the center between the arrow A1 and the arrow A2, but is instead oriented in a direction of the arrow A4 with an angle θ3 relative to the arrow A1. It should be noted that θ3<θ2. This is due to the reactive molecules of the orientation film 120 being reduced by the previous first polarized light 94, which cases there to be fewer reactive particles oriented by the second polarized light 96.

Figure 11:
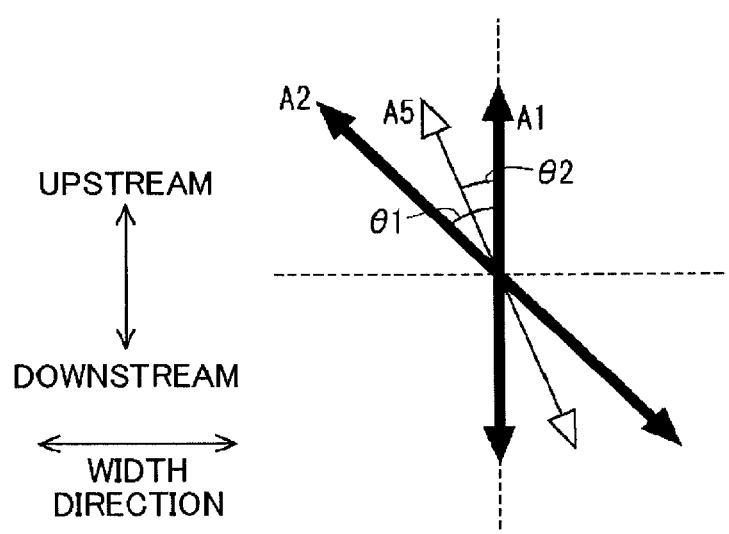
FIG. 11 is used to describe orientation of the orientation film 120 in a case where the exposure amount E1 of the first polarized light 94 is less than the exposure amount E2 of the second polarized light 96.

FIG. 11 is used to describe orientation of the orientation film 120 in a case where the exposure amount E1 of the first polarized light 94 is less than the exposure amount E2 of the second polarized light 96. In the example shown in FIG. 11, the arrow A2 is longer than the arrow A1. In this case, even though the amount of reactive particles is reduced during the prior orientation of the orientation film 120 with the first polarized light 94, since the exposure amount E2 of the second polarized light 96 is greater than the exposure amount E1 of the first polarized light 94, the orientation film 120 is oriented in the direction of the arrow A5, which is at an angle $\theta_2$ (=22.5 degrees) relative to the arrow A1. The relationship between the exposure amount E1 and the exposure amount E2 is E1 ≈0.7×E2, for example.

The following describes a method of manufacturing the optical film 100. First, the sheet resin substrate 90 wound around the feeding roller 12 is prepared. The total length of the sheet resin substrate 90 may be approximately 1000 m, for example. The width of the sheet resin substrate 90 may be approximately 350 mm, for example. After this, during a holding step, one end of the sheet resin substrate 90 is fixed to the winding roller 28.

Next, rotational driving of the winding roller 28 is begun. As a result, the sheet resin substrate 90 is fed from the feeding roller 12 and transported in the transport direction, during a transport step. The transport speed of the sheet resin substrate 90 is from 1 m/s to 10 m/s, for example.

The fed sheet resin substrate 90 is cleaned by the cleaning section 13, and then passes below the orientation film applying section 14. In this way, the unoriented orientation film 120 is applied to the top surface of the sheet resin substrate 90 across substantially the entire width thereof, by the orientation film applying section 14. The application of the orientation film 120 is performed continuously while the sheet resin substrate 90 is being transported. Accordingly, the orientation film 120 is applied continuously to the top surface of the sheet resin substrate 90 across the entire length thereof in the transport direction, expect for a portion at the ends thereof.

The sheet resin substrate 90 having the orientation film 120 applied thereon is transported and passed through the orientation film drying section 16. As a result, the orientation film 120 applied on the top surface of the sheet resin substrate 90 is dried.

After this, during the exposure step, the region of the sheet resin substrate 90 on which the orientation film 120 has been applied is passed below the first aperture section 64, thereby realizing the first orientation step. In the first orientation step, in a state where the sheet resin substrate 90 continues to be transported, the region of the orientation film 120 passing below the first aperture section 64 is oriented by being exposed to the first polarized light 94 that has been output from the light source 30 and the first polarized light output section 50 and passed through the first aperture section 64 of the first mask section 58. Here, the sheet resin substrate 90 is exposed while being continuously transported at a constant speed by the winding roller 28. Accordingly, the orientation film 120 passing below the first aperture section 64 is oriented by the first polarized light 94 output from the first polarized light output section 50, continuously in the transport direction. As a result, the region of the orientation film 120 passing below the first aperture section 64 is exposed to a stripe of light extending in the transport direction and having the same width as the first aperture section 64, to be oriented in correspondence with the first polarized light 94.

After this, the region of the sheet resin substrate 90 having the orientation film 120 applied thereon is transported and passed below the second aperture section 70, thereby realizing the second orientation step. In the second orientation step, in a state where the transport step continues, the second polarized light 96 output from the light source 32 and the second polarized light output section 52 passes through the second aperture section 70 of the second mask section 62 and irradiates the orientation film 120 of the sheet resin substrate 90 formed in the region passing below the second aperture section 70. Since the transport of the sheet resin substrate 90 is continuing, this region of the orientation film 120 is exposed to a stripe of light extending in the transport direction and having the same width as the second aperture section 70. Furthermore, this region of the orientation film 120 is exposed to the second polarized light 96 and oriented in correspondence with the second polarized light 96.

The region of the orientation film 120 passing below the first aperture section 64 and the first aperture elongated portion 66 is exposed to the first polarized light 94, and therefore is oriented in alignment with the polarization direction of the first polarized light 94. As a result, the first orientation region 132 is formed in the region of the orientation film 120 passing below the first aperture elongated portion 66.

The region of the orientation film 120 passing below the second aperture section 70 and the second aperture elongated portion 72 is exposed to the second polarized light 96, and therefore is oriented in alignment with the polarization direction of the second polarized light 96, which is rotated 45 degrees from the polarization direction of the first polarized light 94. As a result, the third orientation region 136 is formed in the region of the orientation film 120 passing below the second aperture elongated portion 72.

The region of the orientation film 120 passing below the first aperture shortened portion 68 and the second aperture shortened portion 74 is exposed to the first polarized light 94 and then exposed to the second polarized light 96. As a result, this region of the orientation film 120 is oriented in alignment with the polarization direction of the first polarized light 94 and this orientation direction is then rotated in the polarization direction of the second polarized light 96. Furthermore, the length of the second aperture shortened portion 74 is greater than the length of the first aperture shortened portion 68, and therefore the exposure amount E2 of the second polarized light 96 is greater than the exposure amount E1 of the first polarized light 94. As a result, the region of the orientation film 120 passing below the first aperture shortened portion 68 and the second aperture shortened portion 74 is oriented in alignment with a direction rotated by 22.5 degrees from the polarization direction of the second polarized light 96 and the polarization direction of the first polarized light 94. In this way, the second orientation region 134 is formed in the region of the orientation film 120 passing below the first aperture shortened portion 68 and the second aperture shortened portion 74.

After this, the sheet resin substrate 90 having the oriented orientation film 120 thereon reaches a location below the liquid crystal film applying section 20. As a result, the liquid crystal film 122 is applied to the top surface of the orientation film 120. The liquid crystal film 122 is applied continuously to the top surface of the orientation film 120 of the sheet resin substrate 90 during transport, and therefore the liquid crystal film 122 is applied across the entire length of the orientation film 120 in the transport direction of the sheet resin substrate 90. After this, the sheet resin substrate 90 with the liquid crystal film 122 applied thereon is transported and passed through the liquid crystal film orienting section 22. As a result, the liquid crystal film 122 is heated by the liquid crystal film orienting section 22 and dried, with the particles of the liquid crystal film 122 being oriented in alignment with the orientation of the orientation film 120 formed therebelow.

Next, the sheet resin substrate 90 on which the applied liquid crystal film 122 has been oriented passes through the liquid crystal film curing section 24. The liquid crystal film 122 is irradiated with ultraviolet rays to cure the liquid crystal film 122 in the oriented state. As a result, the molecules of the liquid crystal film 122 are oriented to correspond respectively to the first orientation region 132, the second orientation region 134, and the third orientation region 136, thereby forming the first liquid crystal region 142, the second liquid crystal region 144, and the third liquid crystal region 146. As a result, as shown in FIGS. 1 and 2, the first polarization modulating sections 102, the second polarization modulating section 104, and the third polarization modulating sections 106 formed by the orientation film 120 and the liquid crystal film 122 are formed periodically in the width direction of the sheet resin substrate 90. Next, the separation film 92 is supplied and affixed to the top surface of the liquid crystal film 122. The sheet resin substrate 90 with the separation film 92 affixed to the top surface thereof is then wound by the winding roller 28.

After this, until the supply of the sheet resin substrate 90 wound on the feeding roller 12 is finished, the orientation film 120 continues to be exposed while the sheet resin substrate 90 is transported by the winding roller 28. Then, the exposure step ends when all of the sheet resin substrate 90 wound on the feeding roller 12 has been supplied. It should be noted that the trailing end of the completed sheet resin substrate 90 may be connected to the leading end of the next new sheet resin substrate 90 and exposure of the orientation film 120 may continue. Finally, the sheet resin substrate 90 with the orientation film 120 and the liquid crystal film 122 formed thereon is cleaved to a prescribed length, thereby completing the optical film 100 having an optical axis that changes in a stepped manner in the width direction, as shown in FIGS. 1 and 2.

As described above, in the exposure apparatus 10, a portion of the first aperture section 64 of the first mask section 58 and a portion of the second aperture section 70 of the second mask section 62 are formed in the same region in the width direction. Accordingly, by forming the region having only the first aperture section 64, the region having only the second aperture section 70, and the region having both the first aperture section 64 and the second aperture section 70 in the width direction, the orientation film 120 can be oriented in different orientation directions. In other words, the exposure apparatus 10 can form three regions with different orientation directions that are the first orientation region 132, the second orientation region 134, and the third orientation region 136, by using one first polarized light output section 50, one second polarized light output section 52, one first mask section 58, and one second mask section 62. In this way, the exposure apparatus 10 can realize a simpler configuration by reducing the number of first polarized light output sections 50 and second polarized light output sections 52 and the number of first mask sections 58 and second mask sections 62, which needed to be the same as the number of polarization modulating sections in the conventional art. Furthermore, by causing the polarization direction of the first polarized light 94 and the polarization direction of the second polarized light 96 to intersect such that the angle between these polarization directions is 45 degrees, i.e. less than 90 degrees, the orientation direction resulting from the orientation by the first polarized light 94 can restrict the direction of rotation caused by the second polarized light 96.

In the exposure apparatus 10, the exposure amount of the first polarized light 94 and the exposure amount of the second polarized light 96 are set according to the length of the first aperture shortened portion 68 and the length of the second aperture shortened portion 74 in the transport direction formed in a region where the first aperture section 64 and the second aperture section 70 overlap in the width direction. As a result, the orientation direction of the orientation film 120, which is determined by the exposure amount of the first polarized light 94 and the exposure amount of the second polarized light 96, can be easily set. Accordingly, the exposure apparatus 10 can easily set the orientation direction without changing the output of the light sources 30 and 32.

In the exposure apparatus 10, the first aperture shortened portion 68 and the second aperture shortened portion 74 formed in the region where the first aperture section 64 and the second aperture section 70 overlap in the width direction have different lengths in the transport direction. Therefore, the degree of freedom for the orientation direction of the region of the orientation film 120 oriented by both the first polarized light 94 and the second polarized light 96 can be improved. In particular, by setting the length of the second aperture shortened portion 74 in the transport direction to be greater than or equal to the length of the first aperture shortened portion 68 in the transport direction, the exposure apparatus 10 can form, in the orientation film 120, the second orientation region 134 in which the orientation direction is a direction that is substantially in the middle between the polarization direction of the first polarized light 94 and the polarization direction of the second polarized light 96.

The following describes an embodiment resulting from changing a portion of the exposure apparatus in the embodiment described above.

Figure 12:
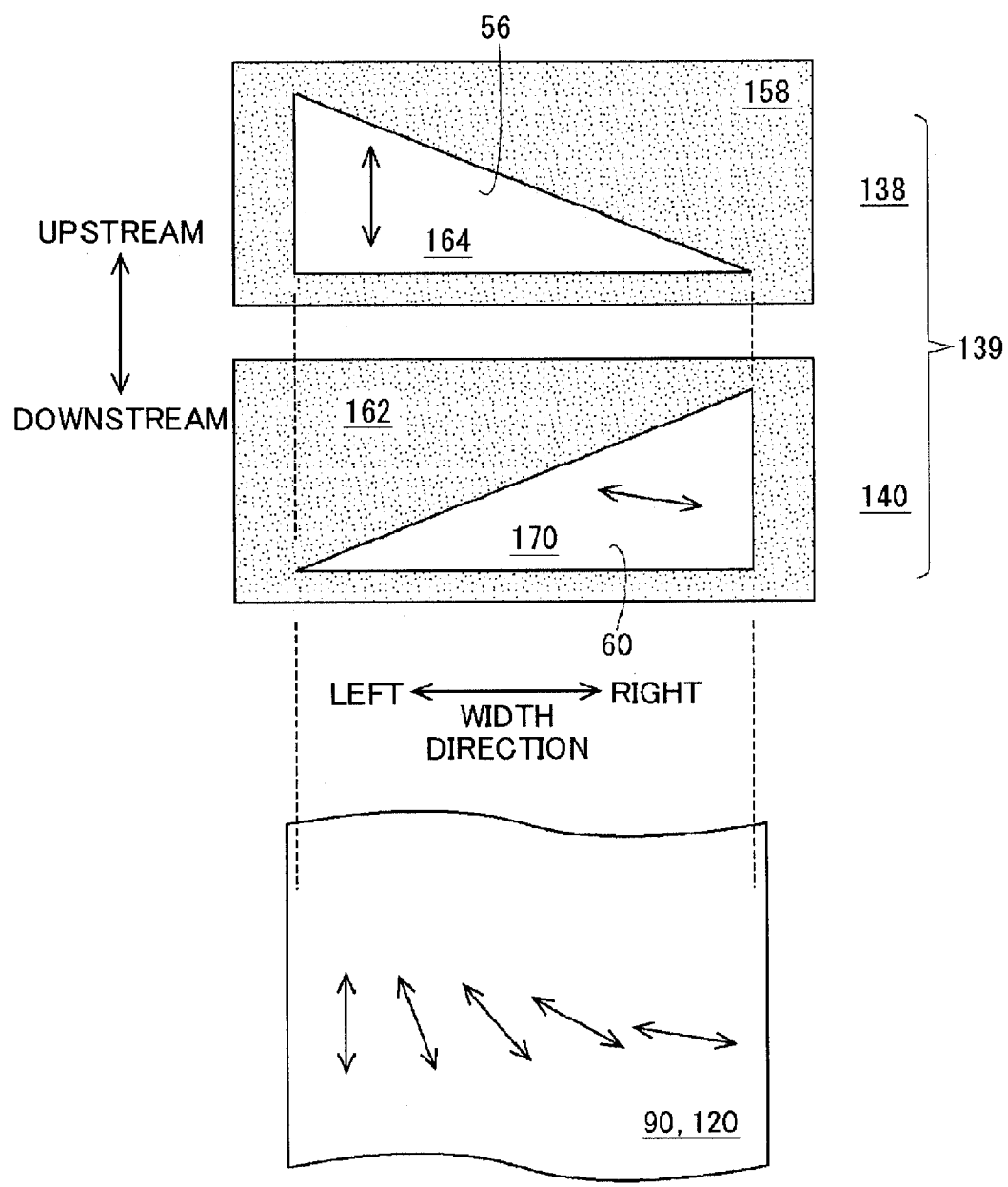
FIG. 12 is a bottom surface view of the changed mask 139.

FIG. 12 shows a bottom surface view of a changed mask 139. The bottom half of FIG. 12 shows the sheet resin substrate 90 and the orientation film 120 oriented using the mask 139. As shown in FIG. 12, the mask 139 includes a first mask 138 and a second mask 140. The first mask 138 is arranged upstream from the second mask 140.

The first mask 138 is arranged in the optical path of the first polarized light 94 output from the first polarized light output section 50. The first mask 138 includes a first mask substrate 56 and a first mask section 158. The first mask section 158 is formed of a material that blocks the first polarized light 94. A first aperture section 164 is formed in the first mask section 158. The first aperture section 164 is shaped as a right triangle. The triangular shape of the first aperture section 164 is formed by one side parallel to the transport direction, one side parallel to the width direction, and one side inclined relative to both the transport direction and the width direction. The length of the first aperture section 164 in the transport direction becomes gradually and continuously smaller towards the right in the width direction.

The second mask 140 is arranged in the optical path of the second polarized light 96 output from the second polarized light output section 52. The second mask 140 includes a second mask substrate 60 and a second mask section 162. The second mask section 162 is formed of a material that blocks the second polarized light 96. The second mask section 162 has a second aperture section formed therein. The second aperture section 170 is shaped as a right triangle. The triangular shape of the second mask section 162 is formed by one side parallel to the transport direction, one side parallel to the width direction, and one side inclined relative to both the transport direction and the width direction. The length of the second mask section 162 in the transport direction becomes gradually and continuously smaller towards the right in the width direction.

The vertex at which the side of the first aperture section 164 parallel to the width direction intersects the side of the first aperture section 164 inclined relative to the width direction and the transport direction is arranged on an extension line of the side of the second aperture section 170 parallel to the transport direction. The vertex at which the side of the second aperture section 170 parallel to the width direction intersects the side of the second aperture section 170 inclined relative to the width direction and the transport direction is arranged on an extension line of the side of the first aperture section 164 parallel to the transport direction.

In a planar view, the side of the first aperture section 164 parallel to the transport direction is arranged further inward than one side of the sheet resin substrate 90 being transported. In a planar view, the side of the second aperture section 170 parallel to the transport direction is arranged further inward than the other side of the sheet resin substrate 90 being transported. Accordingly, the orientation film 120 formed on the sheet resin substrate 90 is exposed to at least one of the first polarized light 94 and the second polarized light 96 across substantially the entire width direction thereof The region of the orientation film 120 near the left end in the width direction is exposed almost entirely to the first polarized light 94. At positions farther from the left end in the width direction, the orientation film 120 is exposed to both the first polarized light 94 and the second polarized light 96. In a direction approaching the right end in the width direction, the orientation film 120 becomes exposed to less of the first polarized light 94 and more of the second polarized light 96. The region of the orientation film 120 near the right end in the width direction is exposed almost entirely to the second polarized light 96.

As shown by the arrows in the region of the first aperture section 164 of FIG. 12, the polarization direction of the first polarized light 94 is parallel to the transport direction. Furthermore, as shown by the arrows in the region of the second aperture section 170, the polarization direction of the second polarized light 96 is inclined from the transport direction. For example, the polarization direction of the second polarized light 96 is inclined by 80 degrees relative to the polarization direction of the first polarized light 94.

In this case, the orientation direction of the orientation film 120 exposed using the first mask 138 and the second mask 140 is as shown by the arrows on the sheet resin substrate 90. Specifically, the region near the left end in the width direction is exposed almost entirely to only the first polarized light 94, and therefore the orientation direction of the orientation film 120 is parallel to the transport direction. In a direction approaching the right side in the width direction, the orientation direction of the orientation film 120 gradually and continuously becomes inclined relative to the transport direction. In the region near the right end side in the width direction, the orientation direction of the orientation film 120 is inclined by substantially 80 degrees from the transport direction.

As described above, the first aperture section 164 and the second aperture section 170 each have one side inclined relative to both the width direction and the transport direction. In this way, the first mask section 158 and the second mask section 162 can gradually change the exposure amount E1 and the exposure amount E2 of the first polarized light 94 and the second polarized light 96 to which the orientation film 120 is exposed, in the width direction. As a result, the first mask section 158 and the second mask section 162 can cause the orientation direction of the orientation film 120 to change gradually and continuously in the width direction, instead of changing in a stepped manner. Therefore, in the optical film exposed using the exposure apparatus 10 provided with the mask 139, the optical axis changes continuously in the width direction.

Figure 13:
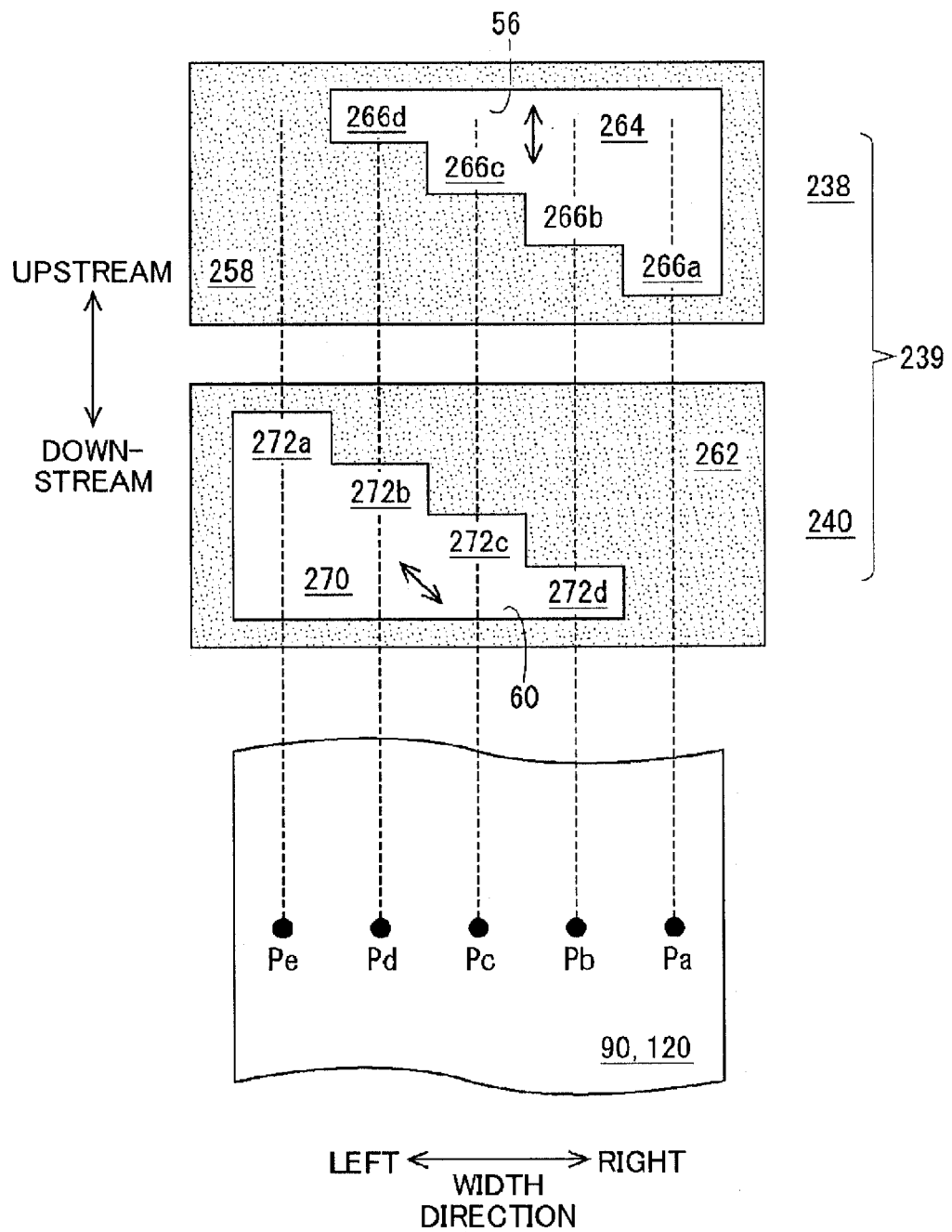
FIG. 13 is a bottom surface view of the changed mask 239.

FIG. 13 is a bottom surface view of a changed mask 239. The bottom half of FIG. 13 shows the sheet resin substrate 90 and the orientation film 120 oriented using the mask 239. As shown in FIG. 13, the mask 239 includes a first mask 238 and a second mask 240. The first mask 238 is arranged upstream from the second mask 240.

The first mask 238 is arranged in the optical path of the first polarized light 94 output from the first polarized light output section 50. The first mask 238 includes a first mask substrate 56 and a first mask section 258. The first mask section 258 is made of a material that bocks the first polarized light 94. A first aperture section 264 is formed in the first mask section 258.

The first aperture section 264 is formed by a plurality of aperture portions, e.g. four aperture portions, including the first aperture portions 266a, 266b, 266c, and 266d. The first aperture portions 266a, 266b, 266c, and 266d are formed with rectangular shapes. The first aperture portions 266a, 266b, 266c, and 266d are each arranged such that the upstream sides thereof match. The first aperture portions 266a, 266b, 266c, and 266d are formed integrally and continuously. The widths of the first aperture portions 266a, 266b, 266c, and 266d in the width direction are equal to each other. The lengths of the first aperture portions 266a, 266b, 266c, and 266d in the transport direction become smaller in a direction toward the right. For example, the lengths of the first aperture portions 266a, 266b, 266c, and 266d in the transport direction may respectively be 20 mm, 15 mm, 10 mm, and 5 mm.

The second mask 240 is arranged in the optical path of the second polarized light 96 output from the second polarized light output section 52. The second mask 240 includes a second mask substrate 60 and a second mask section 262. The second mask section 262 is made of a material that bocks the second polarized light 96. A second aperture section 270 is formed in the second mask section 262.

The second aperture section 270 is formed by a plurality of aperture portions, e.g. four aperture portions, including the second aperture portions 272a, 272b, 272c, and 272d. The second aperture portions 272a, 272b, 272c, and 272d are shaped as rectangles. The second aperture portions 272a, 272b, 272c, and 272d are arranged such that their downstream sides match. The second aperture portions 272a, 272b, 272c, and 272d are formed integrally and continuously. The widths of the second aperture portions 272a, 272b, 272c, and 272d in the width direction are equal to each other. The lengths of the second aperture portions 272a, 272b, 272c, and 272d in the transport direction become smaller in a direction toward the right. For example, the lengths of the second aperture portions 272a, 272b, 272c, and 272d in the transport direction may respectively be 20 mm, 15 mm, 10 mm, and 5 mm.

The first aperture portion 266b is formed in the same region as the second aperture portion 272d, in the width direction. The first aperture portion 266c is formed in the same region as the second aperture portion 272c, in the width direction. The first aperture portion 266d is formed in the same region as the second aperture portion 272b, in the width direction. The first aperture portion 266a and the second aperture portion 272a are formed in regions that do not overlap with any of the second aperture portions 272b, 272c, and 272d and the first aperture portions 266b, 266c, and 266d, in the width direction.

As shown by the arrows in the region of the first aperture section 264 in FIG. 13, the polarization direction of the first polarized light 94 is parallel to the transport direction. Furthermore, as shown by the arrows in the region of the second aperture section 270, the polarization direction of the second polarized light 96 is inclined from the transport direction. The orientation direction is 0 degrees, which is parallel to the transport direction. The orientation direction is a positive direction in the counter-clockwise direction shown in FIG. 13. For example, in a planar view, the polarization direction of the second polarized light 96 is inclined +45 degrees relative to the polarization direction of the first polarized light 94. This case describes an example concerning the orientation directions at the positions Pa, Pb, Pc, Pd, and Pe shown in FIG. 13. It should be noted that the position Pa is on a center line extending along the transport direction and passing through the center of the first aperture portion 266a in the width direction. In the same manner, the position Pb is on a center line passing through the center of the first aperture portion 266b and the second aperture portion 272d in the width direction. The position Pc is on a center line passing through the center of the first aperture portion 266c and the second aperture portion 272c in the width direction. The position Pd is on a center line passing through the center of the first aperture portion 266d and the second aperture portion 272b in the width direction. The position Pe is on a center line passing through the center of the second aperture portion 272a in the width direction.

Figure 14:
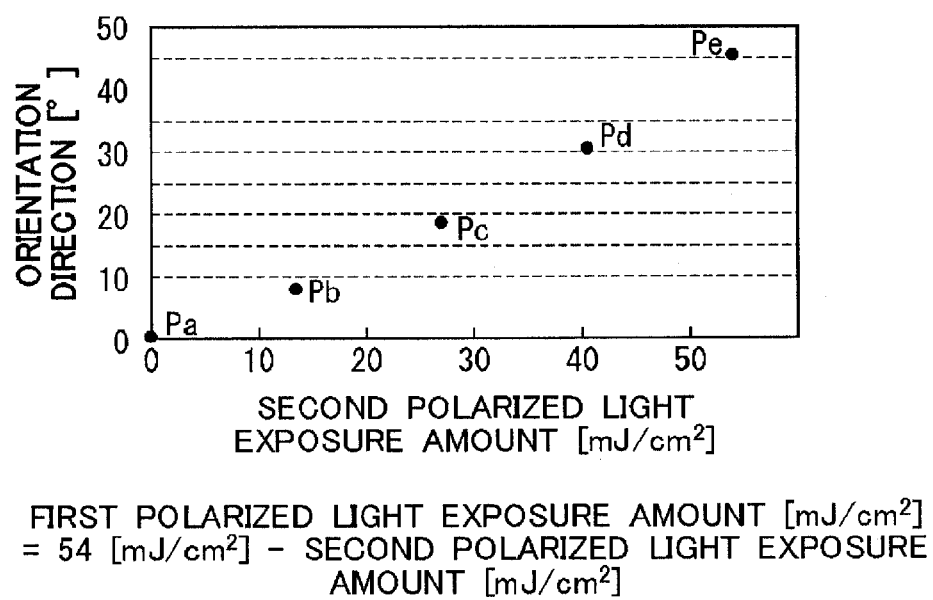
FIG. 14 is a graph for describing the orientation direction at each of the positions Pa, Pb, Pc, Pd, and Pe in FIG. 13.

FIG. 14 is a graph for describing the orientation direction at each of the positions Pa, Pb, Pc, Pd, and Pe in FIG. 13. The exposure amount of the second polarized light 96 at the position Pe is set as 54 mJ/cm$^2$.

As shown in FIG. 14, the region of the orientation film 120 at the right end that is oriented by only the first polarized light 94 is oriented in a direction substantially parallel to the transport direction. Progressing to the left in the width direction, the orientation direction of the orientation film 120 rotates counter-clockwise, and becomes closer to the polarization direction of the second polarized light 96. The orientation film 120 at the left end that is oriented by only the second polarized light 96 is oriented in a direction substantially parallel to the polarization direction of the second polarized light 96, i.e. a direction rotated 45 degrees from the transport direction. Furthermore, the first aperture section 264 and the second aperture section 270 have lengths in the transport direction that change in a stepped manner. Accordingly, in the optical film exposed using the exposure apparatus 10 having the mask 239, the optical axis changes in a stepped manner in the width direction.

The orientation direction at the position Pc, where the first polarized light 94 and the second polarized light 96 have the same exposure amount, is closer to the polarization direction of the first polarized light 94 than the polarization direction of the second polarized light 96. Therefore, it is understood that when orienting the orientation film 120 to have an intermediate position that is not skewed toward the polarization direction of the first polarized light 94 or the polarization direction of the second polarized light 96, it is necessary for the exposure amount of the second polarized light 96 that is used in the later exposure to be greater than the exposure amount of the first polarized light 94.

Figure 15:
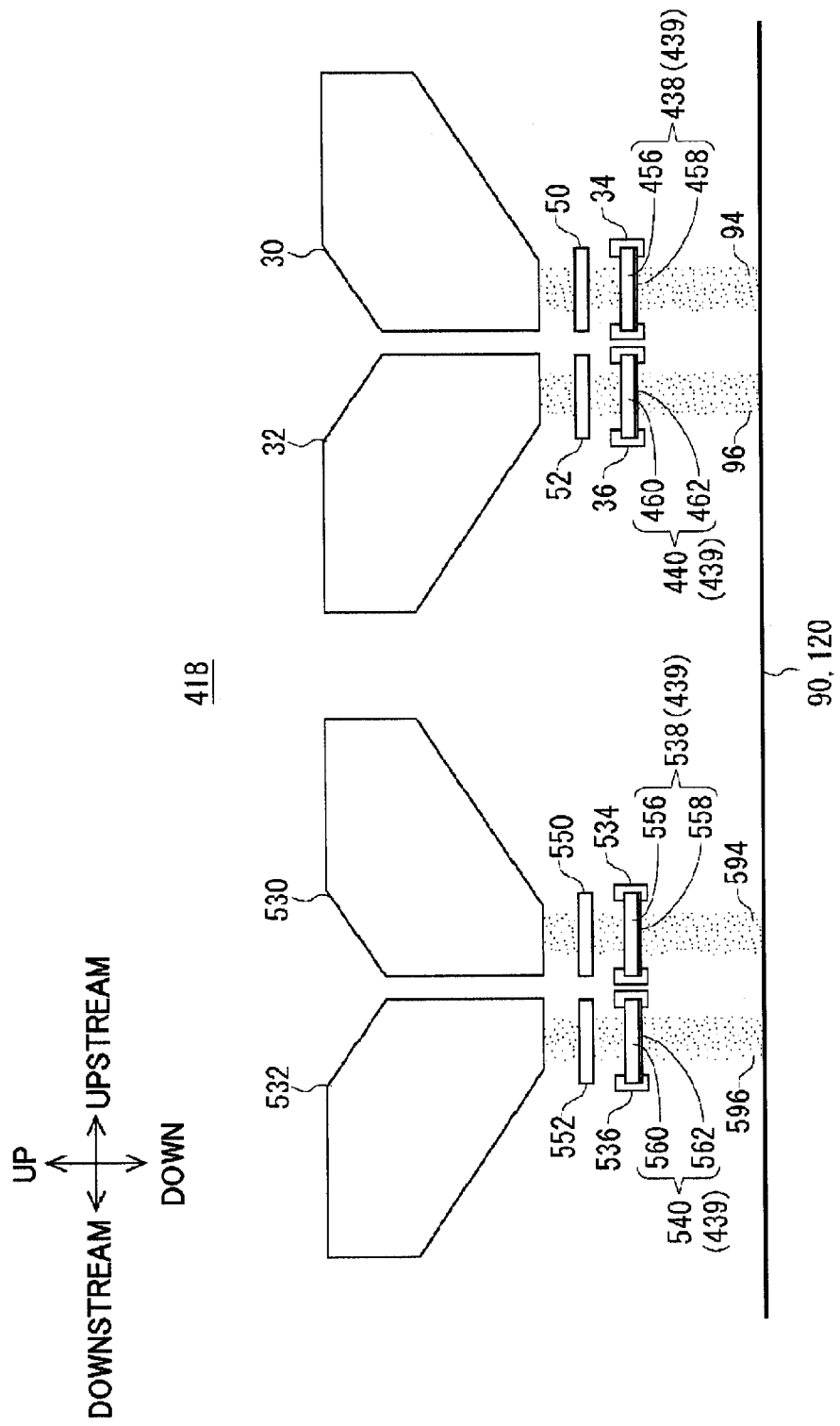
FIG. 15 is used to describe the changed exposing section 418.

FIG. 15 is used to describe a changed exposing section 418. As shown in FIG. 15, the exposing section 418 includes light sources 30, 32, 530, and 532, a first polarized light output section 50, a second polarized light output section 52, a third polarized light output section 550, a fourth polarized light output section 552, mask holding sections 34, 36, 534, and 536, and a mask 439 including a first mask 438, a second mask 440, a third mask 538, and a fourth mask 540.

The light sources 30, 32, 530, and 532 are arranged from upstream to downstream in the transport direction. The light sources 30, 32, 530, and 532 each output ultraviolet rays with the same illuminance.

The first polarized light output section 50, the second polarized light output section 52, the third polarized light output section 550, and the fourth polarized light output section 552 are arranged in the stated order from upstream to downstream in the transport direction. The first polarized light output section 50, the second polarized light output section 52, the third polarized light output section 550, and the fourth polarized light output section 552 respectively output the first polarized light 94, the second polarized light 96, third polarized light 594, and fourth polarized light 596 that have different polarization directions.

The mask holding sections 34, 36, 534, and 536 respectively hold the first mask 438, the second mask 440, the third mask 538, and the fourth mask 540. The first mask 438, the second mask 440, the third mask 538, and the fourth mask 540 are arranged from upstream to downstream in the transport direction.

The first mask 438 is arranged in the optical path of the first polarized light 94. The first mask 438 includes a first mask substrate 456 and a first mask section 458. The second mask 440 is arranged in the optical path of the second polarized light 96. The second mask 440 includes a second mask substrate 460 and a second mask section 462. The third mask 538 is arranged in the optical path of the third polarized light 594. The third mask 538 includes a third mask substrate 556 and a third mask section 558. The fourth mask 540 is arranged in the optical path of the fourth polarized light 596. The fourth mask 540 includes a fourth mask substrate 560 and a fourth mask section 562.

Figure 16:
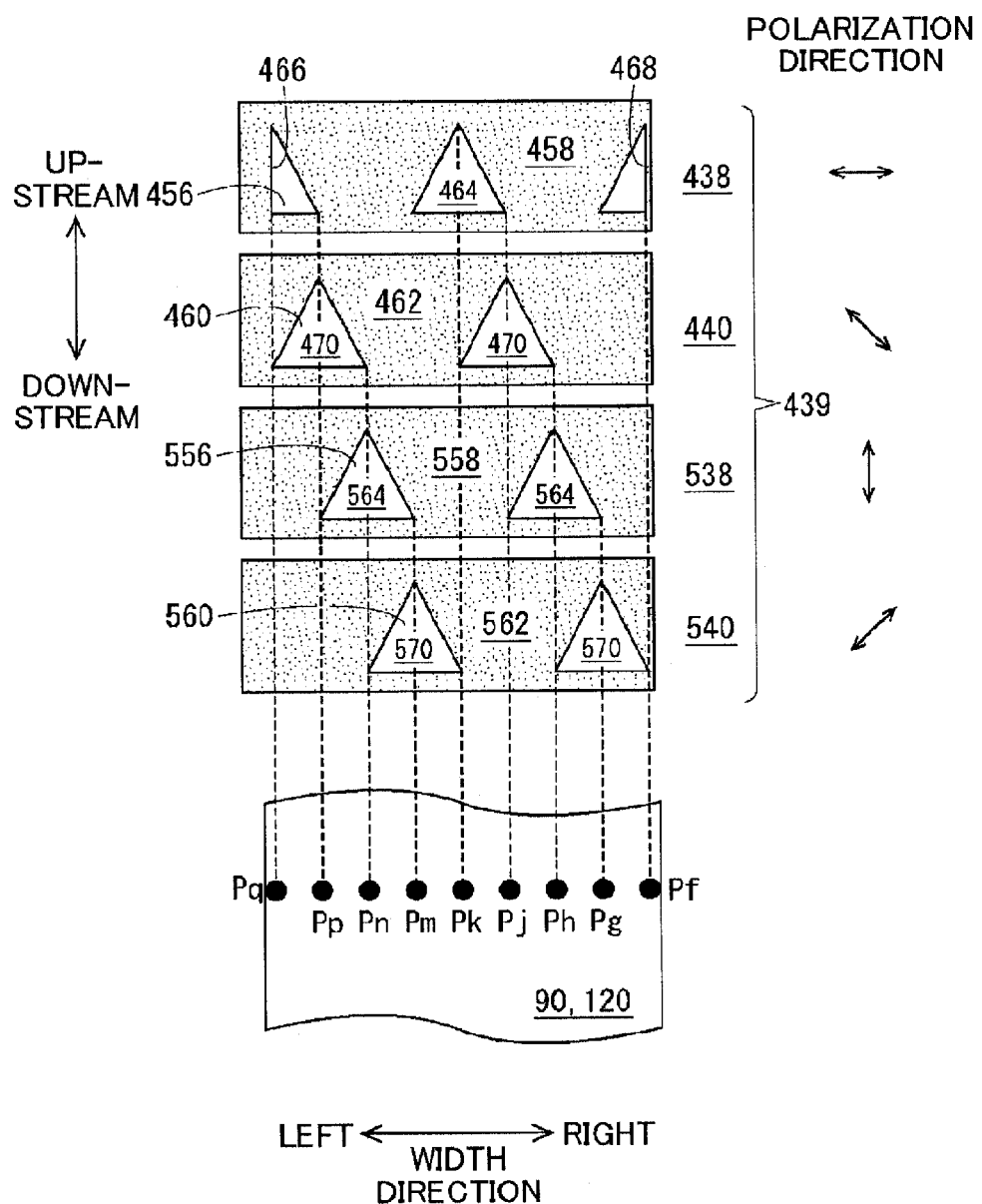
FIG. 16 is a bottom surface view of the mask 439.

FIG. 16 is a bottom surface view of the mask 439. The bottom half of FIG. 16 shows the sheet resin substrate 90 and the orientation film 120 oriented using the mask 439. As shown in FIG. 16, a first triangular aperture section 464 and two half triangular aperture sections 466 and 468 are formed in the first mask section 458. The triangular shape of the first triangular aperture section 464 is that of an isosceles triangle in which the bottom side is 20 mm and the height is 20 mm, for example. The bottom side referred to here is the side that follows along the width direction. Furthermore, the height is the length in the transport direction. Accordingly, the right half of the first triangular aperture section 464 becomes continuously shorter in a direction toward the right in the width direction. On the other hand, the left half of the first triangular aperture section 464 becomes continuously shorter in a direction toward the left in the width direction. The half triangular aperture sections 466 and 468 have shapes obtained by dividing the first triangular aperture section 464 in half. The triangular shape of each of the half triangular aperture sections 466 and 468 is a right triangle with a bottom side of 10 mm and a height of 20 mm, for example. The outer side of each of the half triangular aperture sections 466 and 468 in the width direction is formed parallel to the transport direction. The outer side of the half triangular aperture section 466 on the left side in the width direction is formed at a position further inward than one side of the sheet resin substrate 90 being transported. The outer side of the half triangular aperture section 468 on the right side in the width direction is formed at a position further inward than the other side of the sheet resin substrate 90 being transported.

Two second triangular aperture sections 470 are formed in the second mask section 462. The shape of the second triangular aperture section 470 is the same as the shape of the first triangular aperture section 464. Accordingly, the right half of the second triangular aperture section 470 becomes continuously shorter in a direction toward the right in the width direction. On the other hand, the left half of the second triangular aperture section 470 becomes continuously shorter in a direction toward the left in the width direction. In the width direction, the second triangular aperture section 470 is arranged at a position shifted to the right from the first triangular aperture section 464, by an amount equal to half the length of the bottom side. In other words, one vertex of the bottom sides of the first triangular aperture section 464 or the half triangular aperture sections 466 and 468 is arranged on an extension of the center line of the second triangular aperture section 470 parallel to the transport direction. As a result, the right half of the first triangular aperture section 464 that becomes continuously shorter in a direction toward the right in the width direction is used to expose the same region on the orientation film 120 as the left half of the second triangular aperture section 470 that becomes continuously longer in a direction toward the right in the width direction.

Two third triangular aperture sections 564 are formed in the third mask section 558. The shape of the third triangular aperture section 564 is the same as the shape of the first triangular aperture section 464. Accordingly, the right half of the third triangular aperture section 564 becomes continuously shorter in a direction toward the right in the width direction. On the other hand, the left half of the third triangular aperture section 564 becomes continuously shorter in a direction toward the left in the width direction. In the width direction, the third triangular aperture section 564 is arranged at a position shifted to the right from the second triangular aperture section 470, by an amount equal to half the length of the bottom side. In other words, one vertex of the bottom side of the second triangular aperture section 470 is arranged on an extension of the center line of the third triangular aperture section 564 parallel to the transport direction. As a result, the right half of the second triangular aperture section 470 that becomes continuously shorter in a direction toward the right in the width direction is used to expose the same region on the orientation film 120 as the left half of the third triangular aperture section 564 that becomes continuously longer in a direction toward the right in the width direction.

Two fourth triangular aperture sections 570 are formed in the fourth mask section 562. The shape of the fourth triangular aperture section 570 is the same as the shape of the first triangular aperture section 464. Accordingly, the right half of the fourth triangular aperture section 570 becomes continuously shorter in a direction toward the right in the width direction. On the other hand, the left half of the fourth triangular aperture section 570 becomes continuously shorter in a direction toward the left in the width direction. In the width direction, the fourth triangular aperture section 570 is arranged at a position shifted to the right from the third triangular aperture section 564, by an amount equal to half the length of the bottom side. In other words, one vertex of the bottom side of the third triangular aperture section 564 is arranged on an extension of the center line of the fourth triangular aperture section 570 parallel to the transport direction. As a result, the right half of the third triangular aperture section 564 that becomes continuously shorter in a direction toward the right in the width direction is used to expose the same region on the orientation film 120 as the left half of the fourth triangular aperture section 570 that becomes continuously longer in a direction toward the right in the width direction.

The first triangular aperture section 464 or the first half triangular aperture sections 466 and 468, the second triangular aperture section 470, the third triangular aperture section 564, and the fourth triangular aperture section 570 are arranged periodically in the width direction, with the period being half the length of the bottom side. The number of first triangular aperture sections 464, second triangular aperture sections 470, third triangular aperture sections 564, and fourth triangular aperture sections 570 may be increased, and a plurality of arrangement periods may be formed.

The arrows on the right end of FIG. 16 represent the polarization directions of the first polarized light 94, the second polarized light 96, the third polarized light 594, and the fourth polarized light 596. The polarization direction of the first polarized light 94 is parallel to the width direction. The polarization direction of the second polarized light 96 is rotated 45 degrees counter-clockwise from the polarization direction of the first polarized light 94. The polarization direction of the third polarized light 594 is parallel to the transport direction, i.e. a direction that is rotated 45 degrees counter-clockwise from the polarization direction of the second polarized light 96. The polarization direction of the fourth polarized light 596 is a direction that is rotated 45 degrees counter-clockwise from the polarization direction of the third polarized light 594. In other words, the polarization directions of the first polarized light 94, the second polarized light 96, the third polarized light 594, and the fourth polarized light 596 are at uniform angle intervals.

Positions Pf, Pg, Ph, Pj, Pk, Pm, Pn, Pp and Pq are defined as shown in FIG. 16. The position Pf is a position at the right edge of the sheet resin substrate 90. The position Pq is a position at the left edge of the sheet resin substrate 90. The positions Pf, Pg, Ph, Pj, Pk, Pm, Pn, Pp, and Pq are arranged at intervals equal to half of the bottom side of the first triangular aperture section 464. In other words, the positions Pf, Pg, Ph, Pj, Pk, Pm, Pn, Pp, and Pq are arranged in the width direction at the same positions as the vertices of the first triangular aperture section 464 or the half triangular aperture sections 466 and 468, the second triangular aperture section 470, the third triangular aperture section 564, and the fourth triangular aperture section 570.

Figure 17:
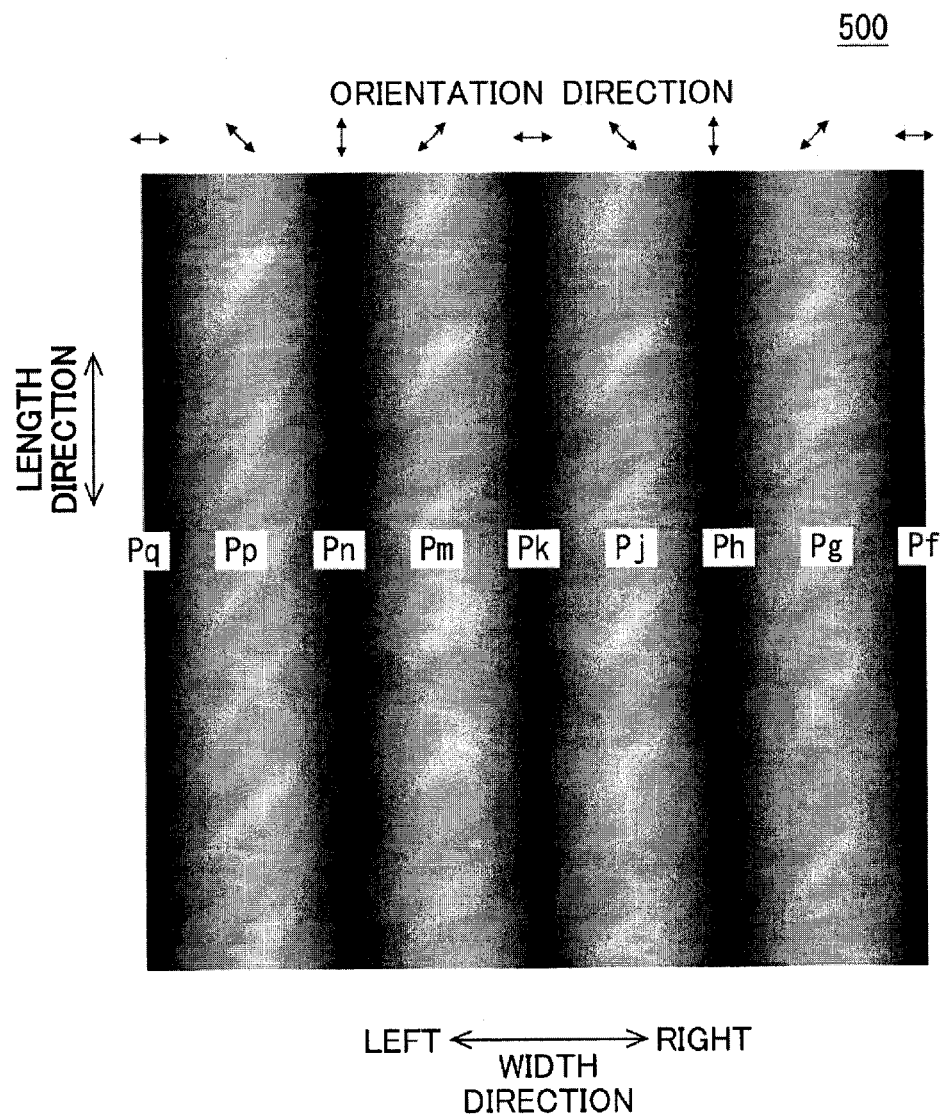
FIG. 17 is a photograph of an optical film 500 oriented using the mask 439 shown in FIG. 16.

FIG. 17 is a photograph of an optical film 500 oriented using the mask 439 shown in FIG. 16. The optical film 500 has the liquid crystal film 122 with a half-wave plate retardation formed on the orientation film 120. The photograph of FIG. 17 was taken after arranging two polarization plates around the optical film 500 in a crossed Nicols state. The positions Pf, Pg, Ph, Pj, Pk, Pm, Pn, Pp, and Pq shown in FIGS. 16 and 17 correspond respectively to each other. The arrows in the top portion of FIG. 17 indicate the orientation direction at the positions Pf, Pg, Ph, Pj, Pk, Pm, Pn, Pp, and Pq. As shown in FIG. 17, it is understood that the optical film 500 has an orientation direction that changes gradually and periodically in a direction from right to left in the width direction. In this way, by inclining one side of each of the first triangular aperture section 464 or the half triangular aperture sections 466 and 468, the second triangular aperture section 470, the third triangular aperture section 564, and the fourth triangular aperture section 570, the orientation direction can be changed gradually and periodically. As a result, it is understood that in the optical film exposed using the exposure apparatus that has adopted the exposing section 418 provided with the mask 439, the optical axis changes continuously in the width direction.

Furthermore, the orientation film 120 is exposed to the first polarized light 94, the second polarized light 96, the third polarized light 594, and the fourth polarized light 596 that have four different polarization directions. Therefore, in different regions of the orientation film 120 in the width direction, the orientation direction relative to the width direction can be from 0 degrees to 180 degrees. As a result, when applying the optical film having the orientation film 120 shown in FIG. 16 for a light control window pair, finer light control can be performed continuously.

Figure 18:
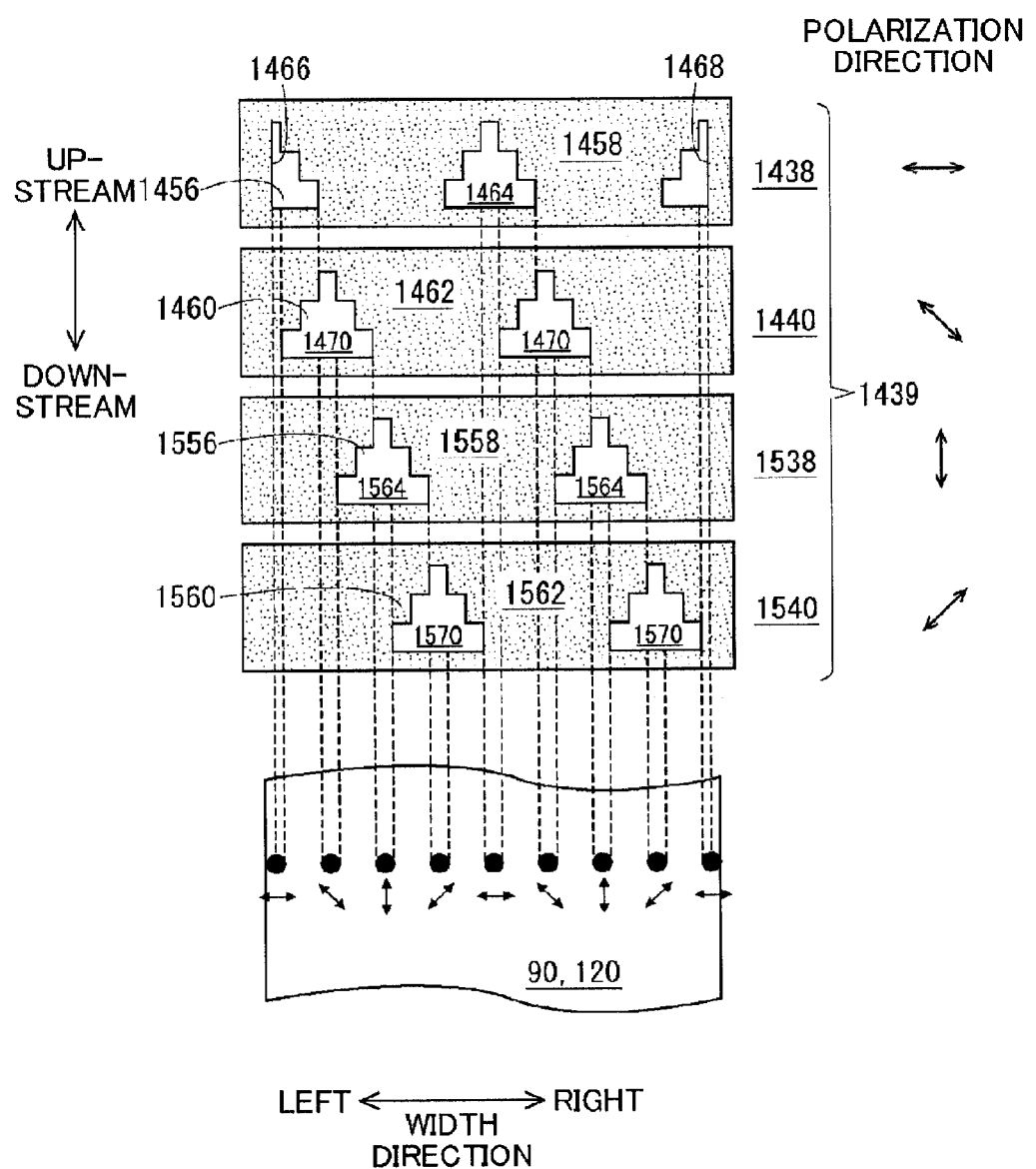
FIG. 18 is a bottom surface view of the mask 1439.

FIG. 18 is a bottom surface view of a mask 1439. The bottom half of FIG. 18 shows the sheet resin substrate 90 and the orientation film 120 oriented using the mask 1439. The mask 1439 can be arranged on the exposing section 418 instead of the mask 439 shown in FIG. 16. As shown in FIG. 18, the mask 1439 includes a first mask 1438, a second mask 1440, a third mask 1538, and a fourth mask 1540.

The first mask 1438 includes a first mask substrate 1456 and a first mask section 1458. A first aperture section 1464 and two half aperture sections 1466 and 1468 are formed in the first mask section 1458. The first aperture section 1464 has a triangular in which the bottom side is parallel to the width direction and the other two sides have a stepped shape. The triangular shape of the first aperture section 1464 is an isosceles triangle in which the bottom side is 20 mm and the height is 20 mm, for example. The bottom side referred to here is the side that follows along the width direction. Furthermore, the height is the length in the transport direction. Accordingly, the right half of the first aperture section 1464 becomes shorter in a stepped manner in a direction toward the right in the width direction. On the other hand, the left half of the first aperture section 1464 becomes shorter in a stepped manner in a direction toward the left in the width direction. The half aperture sections 1466 and 1468 have shapes obtained by dividing the first aperture section 1464 in half. The outer side of each of the half aperture sections 1466 and 1468 in the width direction is formed parallel to the transport direction. The outer side of the half aperture section 1466 on the left side in the width direction is formed at a position further inward than one side of the sheet resin substrate 90 being transported. The outer side of the half aperture section 1468 on the right side in the width direction is formed at a position further inward than the other side of the sheet resin substrate 90 being transported.

The second mask 1440 includes a second mask substrate 1460 and a second mask section 1462. Two second aperture sections 1470 are formed in the second mask section 1462. Each second aperture section 1470 has the same shape as the first aperture section 1464. Accordingly, the right half of each second aperture section 1470 becomes shorter in a stepped manner in a direction toward the right in the width direction. On the other hand, the left half of each second aperture section 1470 becomes shorter in a stepped manner in a direction toward the left in the width direction. The second aperture sections 1470 are arranged in the width direction at positions shifted to the right from the first aperture section 1464 by ⅗ of the length of the bottom side. The longest region at the center of each second aperture section 1470 is arranged at a different position than the first aperture section 1464 and the half aperture sections 1466 and 1468 in the width direction. As a result, the two-step region on the right side of the first aperture section 1464 that becomes shorter in a stepped manner toward the right in the width direction and the two-step region on the left side of the second aperture section 1470 that becomes longer in a stepped manner toward the right in the width direction both expose the same region on the orientation film 120.

The third mask 1538 includes a third mask substrate 1556 and a third mask section 1558. Two third aperture sections 1564 are formed in the third mask section 1558. Each third aperture section 1564 has the same shape as the first aperture section 1464. Accordingly, the right half of each third aperture section 1564 becomes shorter in a stepped manner in a direction toward the right in the width direction. On the other hand, the left half of each third aperture section 1564 becomes shorter in a stepped manner in a direction toward the left in the width direction. The third aperture sections 1564 are arranged in the width direction at positions shifted to the right from the second aperture sections 1470 by ⅗ of the length of the bottom side. The longest region at the center of each third aperture section 1564 is arranged at a different position than the second aperture sections 1470 in the width direction. As a result, the two-step regions on the right sides of the second aperture sections 1470 that become shorter in a stepped manner toward the right in the width direction and the two-step regions on the left sides of the third aperture sections 1564 that become longer in a stepped manner toward the right in the width direction both expose the same regions on the orientation film 120.

The fourth mask 1540 includes a fourth mask substrate 1560 and a fourth mask section 1562. Two aperture sections 1570 are formed in the fourth mask section 1562. Each fourth aperture section 1570 has the same shape as the first aperture section 1464. Accordingly, the right half of each fourth aperture section 1570 becomes shorter in a stepped manner in a direction toward the right in the width direction. On the other hand, the left half of each fourth aperture section 1570 becomes shorter in a stepped manner in a direction toward the left in the width direction. The fourth aperture sections 1570 are arranged in the width direction at positions shifted to the right from the third aperture sections 1564 by ⅗ of the length of the bottom side. The longest region at the center of each fourth aperture section 1570 is arranged at a different position than the third aperture sections 1564 in the width direction. As a result, the two-step regions on the right sides of the third aperture sections 1564 that become shorter in a stepped manner toward the right in the width direction and the two-step regions on the left sides of the fourth aperture sections 1570 that become longer in a stepped manner toward the right in the width direction both expose the same regions on the orientation film 120.

The first aperture section 1464 or the half aperture sections 1466 and 1468, the second aperture sections 1470, the third aperture sections 1564, and the fourth aperture sections 1570 are arranged periodically in the width direction, with the period being ⅗ the length of the bottom surface. The number of first aperture sections 1464, second aperture sections 1470, third aperture sections 1564, and fourth aperture sections 1570 may be increased and a plurality of arrangement periods may be formed.

The arrows on the right end of FIG. 18 represent the polarization directions of the first polarized light 94, the second polarized light 96, the third polarized light 594, and the fourth polarized light 596. The polarization direction of the first polarized light 94 is parallel to the width direction. The polarization direction of the second polarized light 96 is rotated 45 degrees clockwise from the polarization direction of the first polarized light 94. The polarization direction of the third polarized light 594 is parallel to the transport direction, i.e. a direction that is rotated 45 degrees clockwise from the polarization direction of the second polarized light 96. The polarization direction of the fourth polarized light 596 is a direction that is rotated 45 degrees clockwise from the polarization direction of the third polarized light 594. In other words, the polarization directions of the first polarized light 94, the second polarized light 96, the third polarized light 594, and the fourth polarized light 596 are at uniform angle intervals.

As shown in FIG. 18, it is understood that the orientation direction changes periodically and in a stepped manner in a direction from right to left in the width direction. Therefore, by changing one side of each of the first aperture section 1464 or the half aperture sections 1466 and 1468, the second aperture sections 1470, the third aperture sections 1564, and the fourth aperture sections 1570 in a stepped manner, the orientation direction can be changed gradually in a stepped manner.

Furthermore, the orientation film 120 is exposed to the first polarized light 94, the second polarized light 96, the third polarized light 594, and the fourth polarized light 596 that have four different polarization directions. Therefore, in different regions of the orientation film 120 in the width direction, the orientation direction relative to the width direction can be from 0 degrees to 180 degrees. As a result, in the optical film exposed using the exposure apparatus having the exposing section 418 provided with the mask 1439, the optical axis changes in a stepped manner in the width direction. Furthermore, when applying the optical film having the orientation film 120 shown in FIG. 18 for a light control window pair, finer light control can be performed in a stepped manner. It should be noted that each of the first aperture section 1464, the second aperture sections 1470, the third aperture sections 1564, and the fourth aperture sections 1570 may be divided into a plurality of aperture sections. In this case, the shape of these apertures may be bands whose lengths in the transport direction become longer or shorter in a stepped manner, in the width direction, with intervals between the steps of the first aperture section 1464, the second aperture sections 1470, the third aperture sections 1564, and the fourth aperture sections 1570.

The following describes a state in which the exposing section is changed.

Figure 19:
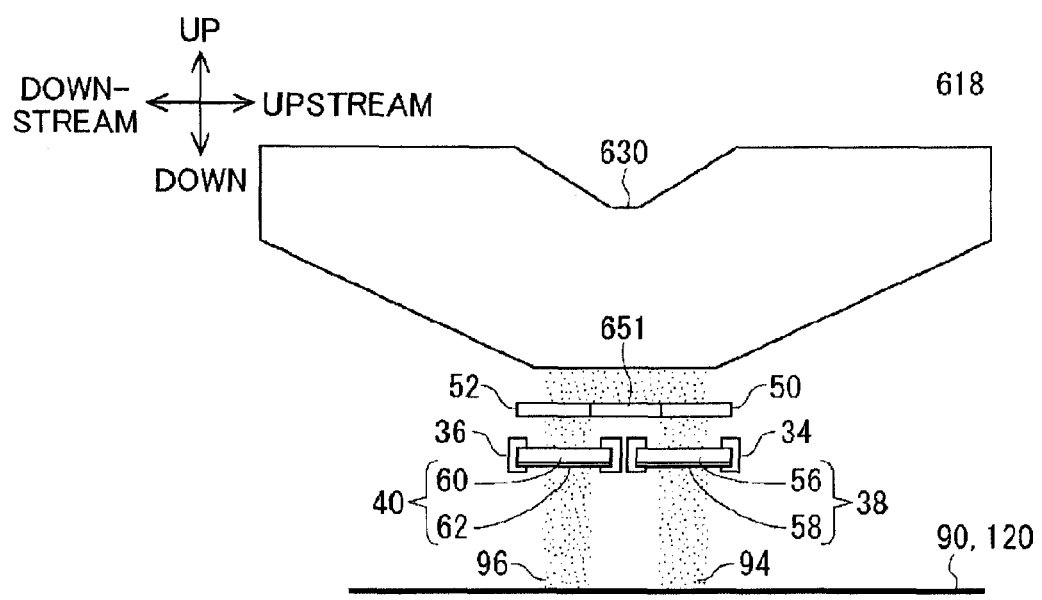
FIG. 19 shows a configuration of the changed exposing section 618.

FIG. 19 shows a configuration of a changed exposing section 618. Configurational elements identical to those described above are given the same reference numerals, and redundant descriptions are omitted.

As shown in FIG. 19, the exposing section 618 includes one light source 630 and a light blocking section 651. The light source 630 outputs light, such as ultraviolet rays, to a region straddling the first polarized light output section 50 and the second polarized light output section 52.

The light blocking section 651 is arranged below the polarized light output section 750 and above a region between the first mask 38 and the second mask 40. Therefore, the light blocking section 651 blocks the polarized light propagating between the first mask 38 and the second mask 40.

The exposing section 618 can have a simplified configuration by using only one light source 630. Furthermore, the light blocking section 651 is arranged between the first polarized light output section 50 and the second polarized light output section 52, and therefore the mixing of the first polarized light 94 and the second polarized light 96 can be restricted.

Figure 20:
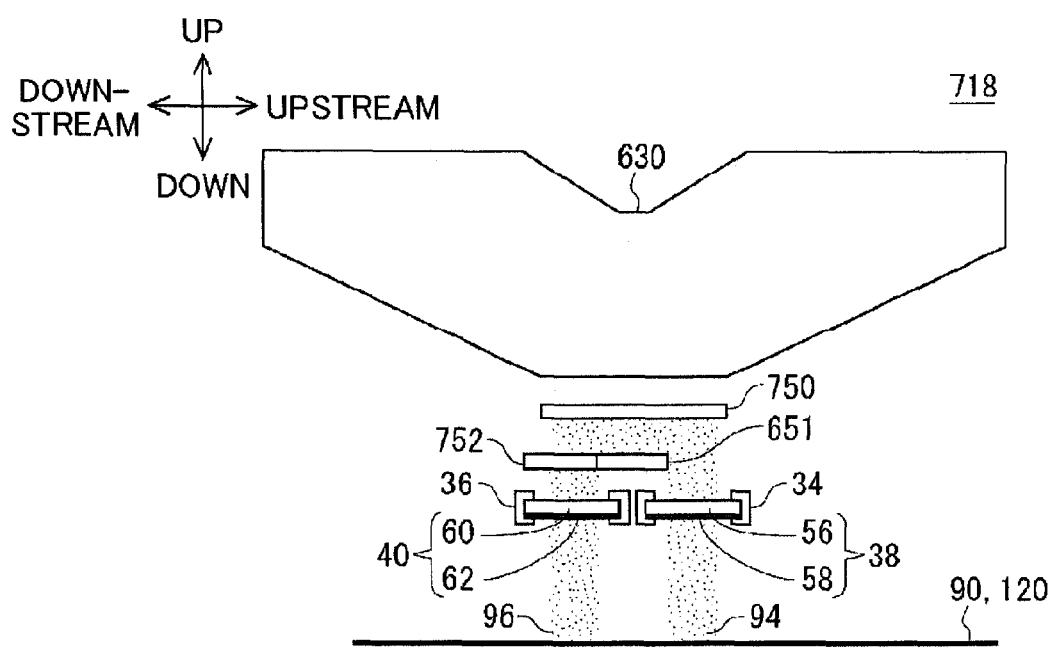
FIG. 20 shows a configuration of another changed exposing section 718.

FIG. 20 shows a configuration of a changed exposing section 718. Configurational elements identical to those described above are given the same reference numerals, and redundant descriptions are omitted.

As shown in FIG. 20, the exposing section 718 includes one light source 630, a polarized light output section 750, a λ/2 retardation plate 752, and a light blocking section 651. The polarized light output section 750 polarizes the light from the light source 630 and outputs the resulting light. The polarized light output section 750 is a Brewster plate, for example. The λ/2 retardation plate 752 is arranged below the polarized light output section 750 and above the second mask 40. The λ/2 retardation plate 752 rotates the polarization direction of the polarized light output from the polarized light output section 750 by 45 degrees, for example. In the embodiment shown in FIG. 20, the region upstream from the polarized light output section 750 corresponds to the first polarized light output section and the λ/2 retardation plate 752 and region downstream from the polarized light output section 750 corresponds to the second polarized light output section.

Figure 21:
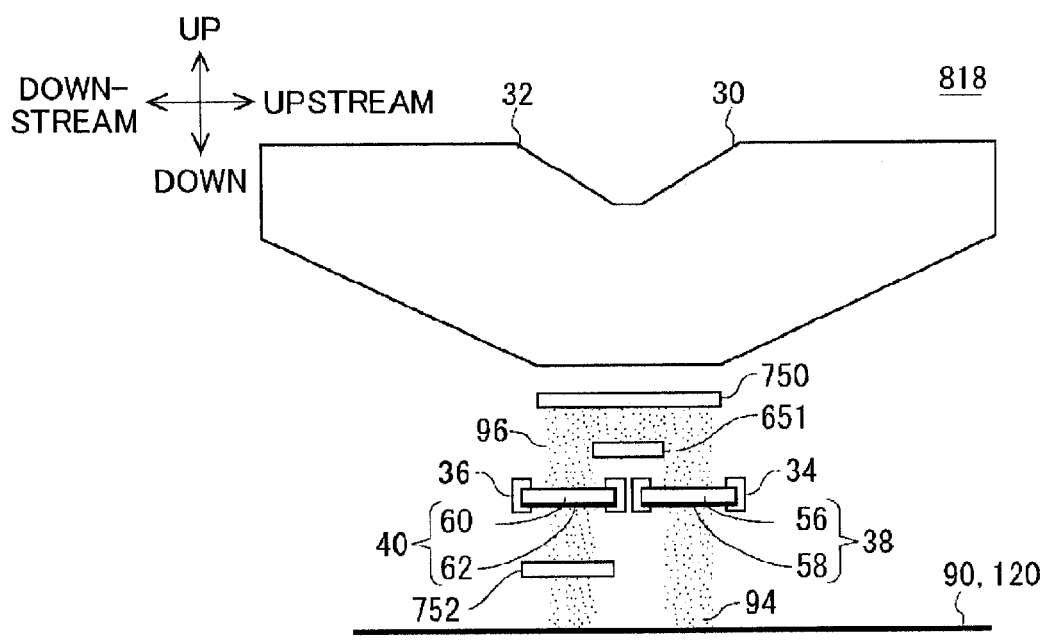
FIG. 21 shows a configuration of another changed exposing section 718.

FIG. 21 shows a configuration of another changed exposing section 818. Configurational elements identical to those described above are given the same reference numerals, and redundant descriptions are omitted. As shown in the exposing section 818 of FIG. 21, the λ/2 retardation plate 752 shown in FIG. 20 may be arranged between the second mask 40 and the sheet resin substrate 90.

The shapes, arrangements, numerical values such as number of components, and materials in the configuration of each embodiment described above may be changed as desired. Furthermore, each of the above embodiments may be combined with others.

For example, the polarization direction of the polarization modulating section may be changed as desired. Furthermore, the polarization direction of the polarized light used for exposure may be changed as desired.

The embodiments described above show examples in which a long sheet-like substrate is continuously transported, but the embodiments may also be applied to an exposure apparatus that repeatedly transports and stops the sheet resin substrate to perform exposure during transport, or to an exposure apparatus that performs exposure while transporting a single resin substrate instead of a resin substrate formed as a continuous length.

In the above embodiments, the first mask section 58 and the second mask section 62 are formed separately, but instead the first mask section 58 and the second mask section 62 may be formed as a single mask substrate. It is also obvious that three or more mask sections may be formed on a single mask substrate.

The polarization directions of the polarized light in the above embodiments are only examples. For example, when performing exposure with polarized light in two polarization directions, the polarization direction of one type of polarized light may be different and less than 90 degrees away from the polarization direction of the other type of polarized light, i.e. different directions that are not orthogonal. By using two different polarization directions that are not orthogonal to each other, it is possible to set the rotation direction by which the orientation is to be rotated by the other type of polarized light after being oriented by the one type of polarized light.

Figure 22:
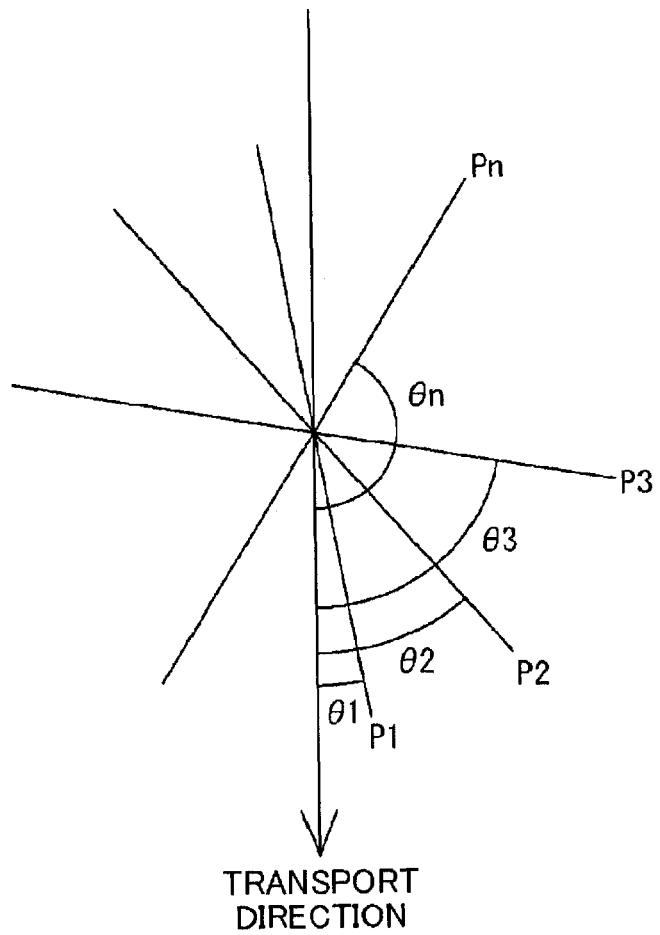
FIG. 22 is used to describe the relationship between the polarization direction and the optical axis of the orientation film.

The above embodiments show examples in which two or four polarized light output sections are provided, but the number of polarized light output sections is not limited to this. FIG. 22 is used to describe the relationship between the polarization direction and the optical axis of the orientation film. As shown in FIG. 22, when the number of polarized light output sections is n, for example, n types of polarized light having different polarization directions are output. Here, n is a natural number greater than or equal to 3. In the same manner, the number of mask sections is set to n.

The polarization directions are P1, P2, . . . , Pn. The types of polarized light having the polarization directions of P1, P2, . . . , Pn may be used for exposure in any order in the transport direction. Accordingly, exposure may be performed in order with the polarized light having the polarization direction P1, the polarized light having the polarization direction P3, and the polarized light having the polarization direction P2, for example.

Here, with the transport direction set as 0 degrees, a counter-clockwise direction in the plane of the orientation film from a direction perpendicular to the plane of the orientation film set as a positive angle direction, and the angle from the transport direction of a polarization direction Pp of the polarized light output from each of the n polarized light output sections 750 set as $\theta_p$ (p=1, 2, . . . , n), when the angle $\theta_p$ satisfies the relationship shown below, it is possible to form the optical axis in the entire range from 0 degrees to 180 degrees. Accordingly, the polarization directions of the polarized light emitted by the n polarized light output sections preferably satisfy the relationship shown below.

$$0° \leq \theta_1 < \theta_2 < \ldots < \theta_n < 180°$$

$$\theta_{p+1} - \theta_p < 90°$$

$$\theta_n - \theta_1 > 90°$$

With this relationship, through exposure to the polarized light with the polarization direction Pp and the polarized light with the polarization direction Pp+1, the optical axis can be formed freely in a direction range from at least $\theta_p$ to no more than $\theta_{p+1}$. In other words, it is understood that the optical axis can be formed freely in a range from at least $\theta_1$ to no more than $\theta_n$.

In a case where the angle difference $(\theta_n - \theta_1)$ from the polarization direction P1 having the minimum angle $\theta_1$ to the polarization direction Pn having the maximum angle $\theta_n$ is less than or equal to 90 degrees, the optical axis can only be set in a direction range from at least $\theta_1$ to no more than $\theta_n$. In other words, the optical axis cannot be set in a direction range from at least 0° to under $\theta_1$ or in a direction range from over $\theta_n$ to under 180°. Accordingly, it is understood that the optical axis can be formed over the entire range from 0° to 180° on the condition that $\theta_n - \theta_1 > 90°$. It should be noted that when 0°≤θ<180°, the polarization direction of a certain angle θ and the polarization direction of the angle (θ+180)° are the same polarization direction.

In this case, the n polarized light output sections preferably output types of polarized light having n polarization directions rotated at intervals of (180/n)°. In this way, the setting of the illuminance of the polarized light output from the polarized light output sections and the setting of the lengths of the apertures in the transport direction formed in the mask sections, for example, become simpler.

The above embodiments describe an example in which the optical film 100 and the like are applied to a light control window member pair 300, but the optical film 100 and the like may be applied to other optical devices. For example, the optical film may be adopted as a low-pass filter used in an image capturing device.

Figure 23:
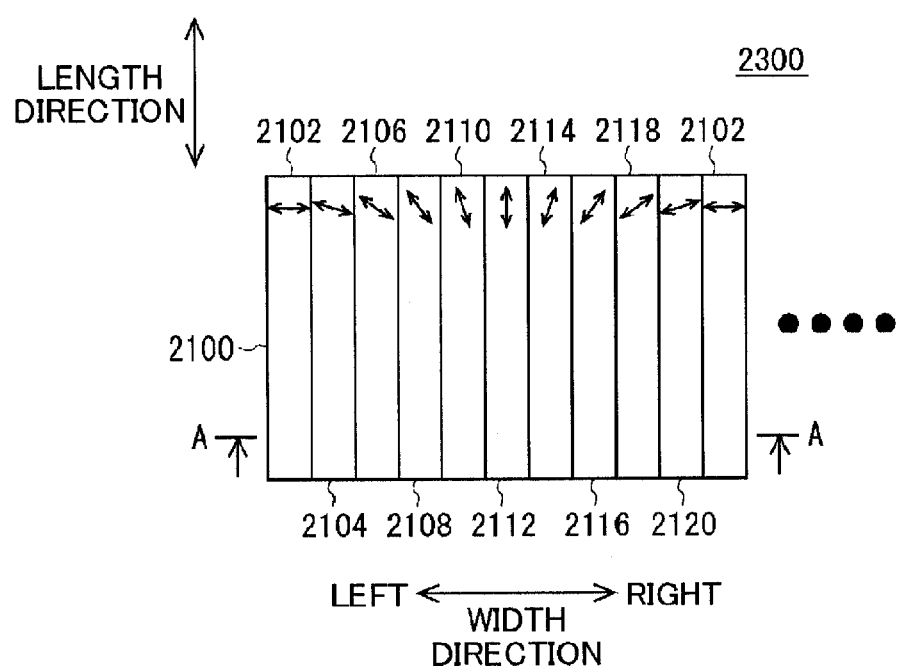
Figure 24:
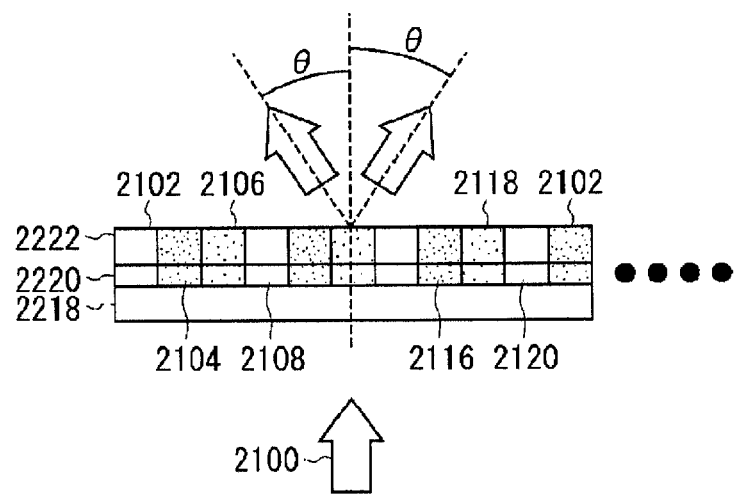
FIG. 24 is a cross-sectional view of the optical film 2300 along the line A-A in FIG. 23.

FIG. 23 is a planar view of an optical film 2300 functioning as a low-pass filter used in an image capturing device or the like. FIG. 24 is a cross-sectional view of the optical film 2300 along the line A-A in FIG. 23. As shown in FIGS. 23 and 24, the optical film 2300 includes a plurality of polarization modulating sections, e.g. the ten polarization modulating sections 2102, 2104, 2106, 2108, 2110, 2112, 2114, 2116, 2118 and 2120. The ten polarization modulating sections 2102, 2104, 2106, 2108, 2110, 2112, 2114, 2116, 2118 and 2120 are formed by an orientation film 2220 and a liquid crystal film 2222 formed on a substrate 2218.

The ten polarization modulating sections 2102, 2104, 2106, 2108, 2110, 2112, 2114, 2116, 2118 and 2120 are arranged periodically in the width direction, in the stated order. The ten polarization modulating sections 2102, 2104, 2106, 2108, 2110, 2112, 2114, 2116, 2118 and 2120 each have the same shape. The ten polarization modulating sections 2102, 2104, 2106, 2108, 2110, 2112, 2114, 2116, 2118 and 2120 each have a different optical axis. The optical axes of the ten polarization modulating sections 2102, 2104, 2106, 2108, 2110, 2112, 2114, 2116, 2118 and 2120 are respectively rotated clockwise by (180/m)°, e.g. 18°, where m is a natural number, in a direction toward the right in the width direction. Each of the ten polarization modulating sections 2102, 2104, 2106, 2108, 2110, 2112, 2114, 2116, 2118 and 2120 delays the phase of the oscillation of light that is parallel to its own slow axis. The ten polarization modulating sections 2102, 2104, 2106, 2108, 2110, 2112, 2114, 2116, 2118 and 2120 function as a λ/2 retardation plate.

In a case where the optical axes change at uniform intervals in this manner, when light 2100 is incident to the optical film 2300, substantially first-order diffracted light is emitted. Here, with the pitch of the diffraction grating set as p and the wavelength of the incident light set as λ, the separation angle θ of the first-order diffracted light is expressed as shown below.

$$\tan \theta = \lambda/p$$

In this way, by arranging the optical film 2300 on the incident side of the image capturing elements of an image capturing apparatus, the Moire fringes occurring when capturing an optical image having a spatial frequency higher than the pixel pitch of the image capturing element can be prevented. The pitch p of the diffraction grating may be 500 μm, for example. Furthermore, when the angle change between the optical axes of adjacent polarization modulating sections is smaller, the first-order diffraction rate is larger and the effect of preventing Moire fringes is greater.

In the embodiments described above, the resin substrate 118 is adopted as the substrate, but a glass substrate may be adopted as the substrate. The glass substrate may have a thickness from 0.05 mm to 5 mm, for example. Examples of the material used to form the glass substrate include alkali glass, non-alkali glass (e.g. OA-10 manufactured by Nippon Electric Glass Co., Ltd.), and quartz glass.

In the above embodiments, the illuminance of each type of light output from the plurality of light sources is the same, but instead each light source may emit light with different illuminance.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10: exposure apparatus, 12: feeding roller. 13: cleaning section, 14: orientation film applying section, 16: orientation film drying section, 18: exposing section, 20: liquid crystal film applying section, 22: liquid crystal film orienting section, 24: liquid crystal film curing section, 26: film supplying section, 28: winding roller, 30: light source, 32: light source, 34: mask holding section, 36: mask holding section, 38: first mask, 39: mask, 40: second mask, 50: first polarized light output section, 52: second polarized light output section, 56: first mask substrate, 58: first mask section, 60: second mask substrate, 62: second mask section, 64: first aperture section, 66: first aperture elongated portion, 68: first aperture shortened portion, 70: second aperture section, 72: second aperture elongated portion, 74: second aperture shortened portion, 90: sheet resin substrate, 92: separation film, 94: first polarized light, 96: second polarized light, 100: optical film, 102: first polarization modulating section, 104: second polarization modulating section, 106: third polarization modulating section, 112: arrow, 114: arrow, 116: arrow, 118: resin substrate, 120: orientation film, 122: liquid crystal film, 132: first orientation region

134: second orientation region, 136: third orientation region, 138: lfirst mask, 139: mask, 140: second mask, 142: first liquid crystal region, 144: second liquid crystal region, 146: third liquid crystal region, 158: first mask section, 162: second mask section, 164: first aperture section, 170: second aperture section, 200: optical film, 202: first polarization modulating section, 204: second polarization modulating section, 206: third polarization modulating section, 238: first mask, 239: mask, 240: second mask, 258: first mask section, 262: second mask section, 264: first aperture section, 266: first aperture portion, 270: second aperture section, 272: second aperture portion, 300: light control window member pair, 310: light control window member, 312: base plate, 314: polarization plate, 320: light control window member, 322: base plate, 324: polarization plate, 330: arrow, 418: exposing section, 438: first mask, 439: mask, 440: second mask, 456: first mask substrate, 458: first mask section, 460: second mask substrate, 462: second mask section, 464: first triangular aperture section, 466: half triangular aperture section, 468: half triangular aperture section, 470: second triangular aperture section, 500: optical film

530: light source, 532: light source, 534: mask holding section, 536: mask holding section, 538: third mask, 540: fourth mask, 550: third polarized light output section, 552: fourth polarized light output section, 556: mask substrate, 558: third mask, 560: fourth mask substrate, 562: fourth mask, 564: third triangular aperture section, 570: fourth triangular aperture section, 594: third polarized light, 596: fourth polarized light, 618: exposing section, 630: light source, 651: light blocking section, 718: exposing section, 750: polarized light output section, 752: λ/2 retardation plate, 818: exposing section, 1438: first mask, 1439: mask, 1440: second mask, 1456: first mask substrate, 1458: first mask section, 1460: second mask substrate, 1462: second mask section, 1464: first aperture section, 1466: half aperture section, 1468: half aperture section, 1470: aperture section, 1538: third mask, 1540: fourth mask, 1556: third mask substrate, 1558: third mask, 1560: fourth mask substrate, 1562: fourth mask, 1564: third aperture section, 1570: fourth aperture section, 2100: light, 2102: polarization modulating section, 2104: polarization modulating section, 2106: polarization modulating section, 2108: polarization modulating section, 2110: polarization modulating section, 2112: polarization modulating section, 2114: polarization modulating section, 2116: polarization modulating section, 2118: polarization modulating section, 2120: polarization modulating section, 2218: substrate, 2220: orientation film, 2222: liquid crystal film, 2300: optical film

What is claimed is:
1. An exposure apparatus comprising:
a transporting section that transports a substrate with an orientation film formed thereon in a transport direction;
a first polarized light output section that outputs first polarized light having a first polarization direction toward the orientation film of the substrate;
a second polarized light output section that is arranged downstream from the first polarized light output section in the transport direction, and outputs second polarized light having a second polarization direction toward the orientation film of the substrate, the second polarization direction intersecting the first polarization direction at an angle of less than 90 degrees;
a first mask section that is arranged between the substrate and the first polarized light output section, blocks a portion of the first polarized light, and has formed therein a first aperture section that passes an unblocked portion of the first polarized light for exposing the orientation film; and
a second mask section that is arranged between the substrate and the second polarized light output section, blocks a portion of the second polarized light, and has formed therein a second aperture section that passes an unblocked portion of the second polarized light for exposing the orientation film, wherein
the first aperture section and the second aperture section are formed to expose a certain region of the orientation film in an overlapping manner,
the first aperture section has a first aperture region that passes the first polarized light toward the certain region, and
the second aperture section has a second aperture region that passes the second polarized light toward the certain region, wherein
at least at some positions in an orthogonal direction that is orthogonal to the transport direction, length of the first aperture region in the transport direction is different from length of the second aperture region in the transport direction.

2. The exposure apparatus according to claim 1, wherein at the at least some positions, the length of the first aperture region in the transport direction is less than the length of the second aperture region in the transport direction.

3. The exposure apparatus according to claim 1, wherein there are a plurality of the first aperture sections separated from each other,
there are a plurality of the second aperture sections separated from each other,
lengths of the first aperture sections in the transport direction are different from each other, and
lengths of the second aperture sections in the transport direction are different from each other.

4. The exposure apparatus according to claim 1, wherein the first aperture section includes one region in which length of the first aperture region in the transport direction becomes smaller in a stepped manner, in a first direction of the orthogonal direction, and
the second aperture section includes a region in which length of the second aperture region, which is used to expose the same region as the one region, in the transport direction becomes larger in a stepped manner, in the first direction of the orthogonal direction.

5. The exposure apparatus according to claim 4, wherein the first aperture section further includes another region in which length of the first aperture region in the transport direction becomes smaller in a stepped manner, in a second direction of the orthogonal direction, and
the second aperture section further includes a region in which length of the second aperture region, which is used to expose the same region as the other region, in the transport direction becomes larger in a stepped manner, in the second direction of the orthogonal direction.

6. The exposure apparatus according to claim 1, wherein the first aperture section includes one region in which length of the first aperture region in the transport direction becomes smaller in a continuous manner, in a first direction of the orthogonal direction, and
the second aperture section includes a region in which length of the second aperture region, which is used to expose the same region as the one region, in the transport direction becomes larger in a continuous manner, in the first direction of the orthogonal direction.

7. The exposure apparatus according to claim 6, wherein the first aperture section further includes another region in which length of the first aperture region in the transport direction becomes smaller in a continuous manner, in a second direction of the orthogonal direction, and
the second aperture section further includes a region in which length of the second aperture region, which is used to expose the same region as the other region, in the transport direction becomes larger in a continuous manner, in the second direction of the orthogonal direction.

8. An optical film manufactured through exposure using the exposure apparatus according to claim 1.

9. The optical film according to claim 8, wherein an optical axis changes continuously in an orthogonal direction that is orthogonal to the transport direction.

10. An exposure apparatus comprising:
a transporting section that transports a substrate with an orientation film formed thereon in a transport direction;
a first polarized light output section that outputs first polarized light having a first polarization direction toward the orientation film of the substrate;
a second polarized light output section that is arranged downstream from the first polarized light output section in the transport direction, and outputs second polarized light having a second polarization direction toward the orientation film of the substrate, the second polarization direction intersecting the first polarization direction at an angle of less than 90 degrees;
a first mask section that is arranged between the substrate and the first polarized light output section, blocks a portion of the first polarized light, and has formed therein a first aperture section that passes an unblocked portion of the first polarized light for exposing the orientation film; and
a second mask section that is arranged between the substrate and the second polarized light output section, blocks a portion of the second polarized light, and has formed therein a second aperture section that passes an unblocked portion of the second polarized light for exposing the orientation film, wherein
the first aperture section and the second aperture section are formed to expose a certain region of the orientation film in an overlapping manner,
the first aperture section has a first aperture region that passes the first polarized light toward the certain region, and the second aperture section has a second aperture region that passes the second polarized light toward the certain region, and the exposure apparatus further comprising:

n polarized light output sections including the first polarized light output section and the second polarized light output section, where n is a natural number of three or more; and n mask sections including the first mask section and the second mask section, wherein with the transport direction being 0°, a counter-clockwise direction viewed in a plane of the orientation film from a direction perpendicular to the plane of the orientation film being a positive angle direction, and an angle of the polarization direction, from the transport direction, of the polarized light output respectively by the n polarized light output sections being $\theta_p$, where p=1, 2, . . . , n, the following relationships are satisfied:

$$0° \leq \theta_1 < \theta_2 < \ldots < \theta_n < 180°,$$

$$\theta_{p+1} - \theta_p < 90°, \text{ and}$$

$$\theta_n - \theta_1 > 90°.$$

11. The exposure apparatus according to claim 10, wherein the n polarized light output sections output types of polarized light having polarization directions rotated at intervals of $(180/n)°$ from each other.

12. A mask that is arranged in optical paths of first polarized light and second polarized light output to a substrate on which an orientation film is formed, the substrate being transported in a transport direction, where the second polarized light intersects the first polarized light at an angle of less than 90 degrees, the mask comprising:

a first mask section that is arranged in the optical path of the first polarized light, blocks a portion of the first polarized light, and has formed therein a first aperture section that passes an unblocked portion of the first polarized light; and a second mask section that is arranged in the optical path of the second polarized light, blocks a portion of the second polarized light, and has formed therein a second aperture section that passes an unblocked portion of the second polarized light, wherein the first aperture section and the second aperture section are formed to expose a certain region of the orientation film in an overlapping manner, the first aperture section has a first aperture region that passes the first polarized light toward the certain region, and the second aperture section has a second aperture region that passes the second polarized light toward the certain region, and at least at some positions in an orthogonal direction that is orthogonal to the transport direction, length of the first aperture region in the transport direction is different from length of the second aperture region in the transport direction.

* * * * *